United States Patent
Ishizuka et al.

(10) Patent No.: US 10,728,663 B2
(45) Date of Patent: Jul. 28, 2020

(54) METHOD AND APPARATUS FOR SETTING FILTER FREQUENCY RESPONSE

(71) Applicant: YAMAHA CORPORATION, Hamamatsu-shi (JP)

(72) Inventors: Kenji Ishizuka, Hamamatsu (JP); Kenichi Tamiya, Hamamatsu (JP); Kazunobu Kondo, Toyohashi (JP); Toshifumi Kunimoto, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/364,377

(22) Filed: Mar. 26, 2019

(65) Prior Publication Data

US 2019/0222932 A1   Jul. 18, 2019

Related U.S. Application Data

(63) Continuation of application No. PCT/JP2017/035279, filed on Sep. 28, 2017.

(30) Foreign Application Priority Data

Sep. 28, 2016 (JP) .................. 2016-189814
Sep. 28, 2016 (JP) .................. 2016-189815
Sep. 28, 2016 (JP) .................. 2016-189821

(51) Int. Cl.
*H04R 3/04*    (2006.01)
*H04S 7/00*    (2006.01)
(Continued)

(52) U.S. Cl.
CPC ............. *H04R 3/04* (2013.01); *H03G 5/025* (2013.01); *H03G 5/165* (2013.01);
(Continued)

(58) Field of Classification Search
None
See application file for complete search history.

(56) References Cited

U.S. PATENT DOCUMENTS 5,572,443 A    11/1996  Emoto et al.
5,581,621 A *  12/1996  Koyama .............. H04S 7/301
                                            381/103
(Continued)

FOREIGN PATENT DOCUMENTS

JP   H0746687 A    2/1995
JP   H11069280 A   3/1998
(Continued)

OTHER PUBLICATIONS

International Search Report issued in Intl. Appln. No. PCT/JP2017/035279 dated Dec. 12, 2017. English translation provided.
(Continued)

*Primary Examiner* — Kenny H Truong
(74) *Attorney, Agent, or Firm* — Rossi, Kimms & McDowell LLP

(57) ABSTRACT

A method for setting a filter frequency response includes: dividing a target frequency band into multiple first partial bands at a frequency corresponding to an intersection between a first line representative of a target spectrum envelope and a second line representative of a first spectrum envelope derived from smoothing a measured frequency spectrum; and setting a frequency response of a filter corresponding to a first partial band specified by an operator from among the multiple first partial bands, in accordance with a setting operation for setting an adjustment amount performed by the operator with respect to the specified first partial band.

16 Claims, 8 Drawing Sheets

(51) Int. Cl.
*H03G 5/02* (2006.01)
*H03G 5/16* (2006.01)
*H03H 17/02* (2006.01)

(52) U.S. Cl.
CPC ......... *H03H 17/0248* (2013.01); *H04S 7/301* (2013.01); *H04R 2227/007* (2013.01); *H04S 7/307* (2013.01)

(56) References Cited

U.S. PATENT DOCUMENTS

| | | |
|---|---|---|
| 6,072,879 A | 6/2000 | Ouchi et al. |
| 2011/0096933 A1* | 4/2011 | Eastty .................. H03G 3/00 381/56 |
| 2014/0177871 A1* | 6/2014 | Morton .................. H04R 3/04 381/99 |

FOREIGN PATENT DOCUMENTS

| | | |
|---|---|---|
| JP | 2004266385 A | 9/2004 |
| JP | 2008224816 A | 9/2008 |
| JP | 5708693 B2 | 4/2015 |

OTHER PUBLICATIONS

Written Opinion issued in Intl. Appln. No. PCT/JP2017/035279 dated Dec. 12, 2017.
"Lake Controller Operation Manual, Rev 1.3.6J." LAB Gruppen. Online searched on Sep. 27, 2016. URL: http://ip.music-group.com/LAB/download/Lake_Controller_Operation_Manual_136J.pdf. English translation provided. Cited in Specification.

* cited by examiner

METHOD AND APPARATUS FOR SETTING FILTER FREQUENCY RESPONSE

CROSS REFERENCE TO RELATED APPLICATIONS

This application is a Continuation Application of PCT Application No. PCT/JP2017/035279, filed on Sep. 28, 2017, and is based on and claims priority from Japanese Patent Application No. 2016-189814, filed on Sep. 28, 2016, Japanese Patent Application No. 2016-189815, filed on Sep. 28, 2016, and Japanese Patent Application No. 2016-189821, filed on Sep. 28, 2016. The contents of the above applications are incorporated herein by reference in their entirety.

BACKGROUND

Field of the Disclosure

The present disclosure relates to a technique for adjusting frequency characteristics of an overall sound reproduction system that includes a sound space, such as a concert hall, and loudspeakers installed in the sound space, based on frequency characteristics to be achieved (hereafter, target characteristics).

Description of the Related Art

A case is given where target characteristics are to be obtained by performing signal processing on sound signals provided to loudspeakers by use of graphic equalizer (GEQ) and parametric equalizer (PEQ). To this end, it is necessary to appropriately set up in advance parameters (hereafter, correction parameters) for the signal processing in accordance with differences between the target characteristics and frequency characteristics that are actually measured with respect to the overall sound reproduction system. For example, in a case where pronounced peaks that are not present in the target characteristics are present in the frequency characteristics of the overall sound reproduction system, and in a case where these peaks are to be smoothed by using multiple-band PEQ, a sound engineer performs the following tasks. Firstly, the sound engineer sets the center frequency of a band in the PEQ to a frequency corresponding to a peak to be smoothed. Then, the sound engineer sets the Q value of the band to cover the peak. Lastly, the sound engineer adjusts a gain of the band. However, problems exist in that it is difficult for a user to adjust frequency characteristics of the sound reproduction system overall in such a way that the frequency characteristics approach the target characteristics, while independent adjustment is made of three correction parameters: namely, center frequencies, Q values, and gains. It is not possible to make such adjustments easily and intuitively. Non-Patent Document 1 discloses a technique for solving these problems.

Specifically, Non-Patent Document 1 discloses a technique by which a sound engineer is able to set correction parameters via GUI (graphical user interface)-based operations that can be carried out both easily and intuitively. In the technique disclosed in Patent Document 1, the correction parameters are set as follows. A sound engineer selects a desired type of frequency characteristic from among multiple types of frequency characteristics, which are prepared in advance. Next, the sound engineer sets a frequency band in which frequency characteristics are to be adjusted, in accordance with frequency bands that can be output as sound by loudspeakers. Then, while maintaining smooth connections at both ends of the frequency band with neighboring bands, a graph that is representative of the selected type of frequency characteristics is moved upward or downward, thereby setting characteristics to be achieved (target characteristics) (FIG. 15 of Patent Document 1). In the technique disclosed in Patent Document 1, in accordance with differences between actually-measured frequency characteristics and the to-be-achieved characteristics set as described above, adjustment amounts are calculated for frequency characteristics to move the actually-measured characteristics close to the to-be-achieved characteristics; and correction parameters are set in accordance with the calculated adjustment amounts. For example, in a case where frequency characteristics are corrected by performing filtering processing with use of FIR filters, filter coefficients of the FIR filters are set as the correction parameters based on the adjustment amounts referred to above.

RELATED ART DOCUMENTS

Patent Documents

Patent Document 1: Japanese Patent Application Laid-Open Publication No. H07-046687 (U.S. Pat. No. 5,572,443)
Patent Document 2: Japanese Patent No. 5708693

Non-Patent Documents

Non-patent Document 1: "Lake Controller v6 Operation Manual, Rev 1.3.6J", LAB Gruppen; online (searched on Sep. 27, 2016); Internet URL: http://jp.music-group.com/LAB/download/Lake_Controller_Operation_Manual_136J.pdf (Lake Controller Operation Manual Rev 1.3.6, URL: http://downloads.labgruppen.com/Lake_Controller_Operation_Manual.pdf)

In the technique disclosed in Non-Patent Document 1, a problem exists in that no indications (e.g., current values of target characteristics and adjustment amounts) are displayed that can serve as a guide for setting correction parameters, and thus the technique is not user friendly. In the technique disclosed in Patent Document 1, a problem exists in that fine adjustment of frequency characteristics cannot be performed. For example, in the technique disclosed in Patent Document 1, it is not possible to selectively perform adjustment of one or more partial bands that are a part of the frequency band set in the manner described above, such that frequency characteristics in the selected partial bands alone are brought close to target characteristics. In general, even in a case where peaks and dips not present in target characteristics appear in measured frequency characteristics, a sound engineer may not always wish to remove all of these peaks and dips, since doing so could result in deterioration of sound quality. Accordingly, it is highly desirable that a sound engineer is able to specify partial bands and to perform frequency characteristic adjustment on the specified partial bands alone. The technique disclosed in Patent Document 1 does not enable a sound engineer to perform such adjustments.

SUMMARY

The present disclosure is provided in view of the above circumstances, and has as an object provision of a technique by which frequency characteristics can be adjusted in a specified partial band alone, such that the frequency characteristics for adjustment can be brought close to target characteristics by way of operations that are easy and intuitive to perform.

A method for setting a filter frequency response according to a preferred aspect includes: dividing a target frequency band into multiple first partial bands at a frequency corresponding to an intersection between a first line representative of a target spectrum envelope and a second line representative of a first spectrum envelope derived from smoothing a measured frequency spectrum; and setting a frequency response of a filter corresponding to a first partial band specified by an operator from among the multiple first partial bands, in accordance with a setting operation for setting an adjustment amount performed by the operator with respect to the specified first partial band.

An apparatus for setting a filter frequency response according to a preferred aspect includes a processor configured to execute stored instructions to: divide a target frequency band into multiple first partial bands at a frequency corresponding to an intersection between a first line representative of a target spectrum envelope and a second line representative of a first spectrum envelope derived from smoothing a measured frequency spectrum; and set a frequency response of a filter corresponding to a first partial band specified by an operator from among the multiple first partial bands, in accordance with a setting operation for setting an adjustment amount performed by the operator with respect to the specified first partial band.

DESCRIPTION OF THE EMBODIMENTS

First Embodiment

Description of a first embodiment of the present disclosure is given below with reference to the accompanying drawings.

Configuration

Figure 1:
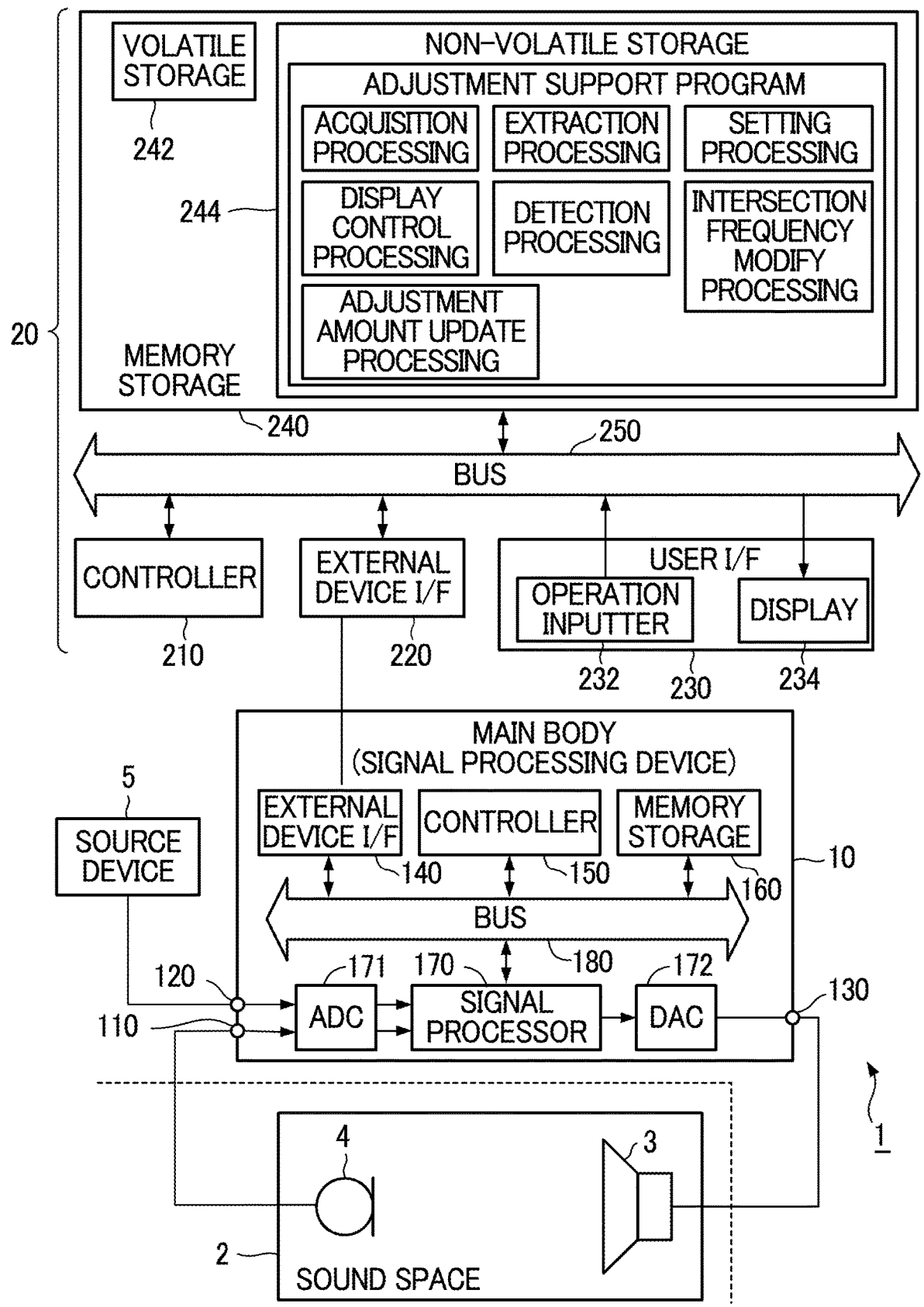
FIG. 1 shows a configuration of a frequency-characteristic adjuster 1 according to an embodiment of the present disclosure.

FIG. 1 is a diagram illustrating a configuration of a frequency-characteristic adjuster 1 according to an embodiment of the present disclosure. The frequency-characteristic adjuster 1 is used to adjust frequency characteristics of an overall sound of a sound reproduction system that includes a sound space 2, such as a concert hall, loudspeakers 3 installed in the sound space 2, and filters. The frequency-characteristic adjuster 1 is an apparatus used for adjusting the frequency characteristics for adjustment to target characteristics (i.e., an apparatus for adjusting frequency characteristics or frequency responses of the filters such that the frequency characteristics for adjustment can be brought close to the target characteristics). As shown in FIG. 1, the frequency-characteristic adjuster 1 includes a main body 10 and a remote controller 20. In this embodiment, the main body 10 and the remote controller 20 are connected to each other by a detachable signal cable, and exchange data with each other via the signal cable. In this embodiment, an exemplary case is described where the main body 10 and the remote controller 20 exchange data via wired communication. Alternatively, the main body 10 and the remote controller 20 may exchange data via wireless communication.

The main body 10 is a signal processing device, such as a DSP (digital signal processor). As shown in FIG. 1, the main body 10 includes a microphone input terminal 110, a source input terminal 120, and a speaker output terminal 130. To the speaker output terminal 130, there is connected a loudspeaker 3 that houses a powered amplifier. To the microphone input terminal 110, there is connected a measurement microphone 4 for measuring frequency characteristics of the overall sound reproduction system. To the source input terminal 120, there is connected a source device 5, such as a CD player, that serves as a sound-output source for output from the loudspeaker 3 to the sound space 2. The main body 10 performs signal processing (filtering) on sound signals input from the source device 5 connected to the source input terminal 120 in accordance with correction parameters set by a user of the frequency-characteristic adjuster 1 (i.e., parameters for controlling frequency responses of the filters). The main body 10 then outputs from the speaker output terminal 130 to the loudspeaker 3 the sound signals that have undergone the signal processing. The type of filters used in the signal processing may be any of FIR filters, GEQ (e.g., 31-band), or PEQ (e.g., 4-band). In this embodiment, FIR filters are used. The user (operator) of the frequency-characteristic adjuster 1 is a sound engineer who uses the frequency-characteristic adjuster 1 to adjust the frequency characteristics for adjustment to the target characteristics. In this embodiment, by appropriately setting the correction parameters, the frequency characteristics for adjustment are brought close to the target characteristics while deterioration in sound quality is minimized.

As shown in FIG. 1, the main body 10 includes an external device interface (I/F) 140, a controller 150, a memory storage 160, a signal processor 170, and a bus 180 that mediates the exchange of data between the above elements of the main body 10. The main body 10 includes an analog-digital converter (ADC) 171 and a digital-analog converter (DAC) 172. The controller 150 is a CPU, for example. Under execution of a signal processing program stored in the memory storage 160, the controller 150 centrally controls operations of the main body (signal processing device) 10, such as data communication with the remote controller 20 via the external device interface 140 and signal processing performed by the signal processor 170. The external device interface 140 consists of multiple interfaces, such as serial interfaces, parallel interfaces, and USB (universal serial bus) interfaces, for connecting various types of external devices to the main body 10. In this embodiment, the remote controller 20 is connected to the external device interface 140 via a signal line.

The ADC 171 converts analog sound signals input from the measurement microphone 4 connected to the microphone input terminal 110 and analog sound signals input from the source device 5 connected to the source input terminal 120, into digital sound signals, and outputs the converted signals to the signal processor 170. Under control of the controller 150, the signal processor 170 performs various kinds of signal processing on sound signals input from the measurement microphone 4 and on sound signals input from the source device 5. The DAC 172 converts digital sound signals that have been input from the source device 5 and have been processed by the signal processor 170 into analog sound signals, and outputs the analog sound signals to the loudspeaker 3 via the speaker output terminal 130.

To achieve the adjustments described above, the user of the frequency-characteristic adjuster 1 first measures initial characteristics of the frequency characteristics for adjustment before adjusting the characteristics. That is, the frequency-characteristic adjuster 1 first measures frequency characteristics of the overall sound reproduction system, which includes the sound space 2, loudspeakers 3 installed in the sound space 2, and the filters, where the frequency responses of the filters are set to be flat (hereafter, such a sound reproduction system is referred to as the sound reproduction system excluding filters). In this embodiment also, measurement of frequency characteristics of the overall sound reproduction system is performed by carrying out steps similar to those in the technique disclosed in Patent Document 1. The user first installs the measurement microphone 4 and a loudspeaker 3 in the sound space 2. Then, the user connects the measurement microphone 4 to the microphone input terminal 110 of the main body 10 of the frequency-characteristic adjuster 1 via an audio cable, and connects the loudspeaker 3 to the speaker output terminal 130.

With the above devices connected to the main body 10, the user uses the remote controller 20 to remotely control the main body 10. The main body 10 provides measuring signals to the loudspeaker 3, and the loudspeaker 3 outputs sound for measuring frequency characteristics (e.g., white noise; hereafter referred to as measurement sound). Direct sound output from the loudspeaker 3 to the sound space 2 and its reflected sound reflected from the walls of the sound space 2 are received by the microphone 4. Sound signals representative of the received sounds are input from the microphone 4 to the main body 10 via the microphone input terminal 110. The main body 10 calculates, from the sound signals input to the microphone input terminal 110, frequency characteristics of the sound reproduction system excluding filters (i.e., frequency characteristics of sound that was output from the loudspeaker 3, passed through the sound space 2, and reached the microphone 4). For example, the main body 10 calculates the frequency characteristics by performing a Fourier transform on the sound signals input to the microphone input terminal 110. Then, the main body 10 transmits data indicative of the frequency characteristics thus calculated to the remote controller 20. In this way, the frequency characteristics of the sound reproduction system excluding filters can be measured.

The remote controller 20 is a laptop or desktop personal computer, for example, and provides a user interface for prompting the user to use the frequency-characteristic adjuster 1. The remote controller 20 remotely controls the signal processor 170 in accordance with the user's operations. In this embodiment, processing by way of the remote controller 20 enables adjustment of frequency characteristics for adjustment to be adjusted either toward or away from target characteristics, with respect to a partial band (frequency band) alone specified by the user from among frequency bands (frequency range) defined depending on frequency bands that the loudspeaker 3 is capable of reproducing as sound. Accordingly, the features of the present embodiment reside in the remote controller 20. The following description is principally directed to the remote controller 20.

As shown in FIG. 1, the remote controller 20 includes a controller 210, an external device interface (I/F) 220, a user interface 230, a memory storage 240, and a bus 250 that mediates the exchange of data between the above elements of the remote controller 20. The controller 210 is a CPU, for example. The controller 210 centrally controls operations of the remote controller 20 under execution of an adjustment support program stored in the memory storage 240. The external device interface 220 consists of multiple interfaces, such as serial interfaces, parallel interfaces, and USB interfaces, for connecting various types of external devices to the remote controller 20. In this embodiment, the main body 10 is connected to the external device interface 220 via a signal line. The user interface 230 provides a user interface for prompting the user to use the frequency-characteristic adjuster 1. As shown in FIG. 1, the user interface 230 includes an operation inputter 232 and a display 234.

The operation inputter 232 is a keyboard or a mouse, for example. When some operations (e.g., pressing keys of the keyboard, mouse-clicking or mouse-dragging) are performed at the operation inputter 232, the operation inputter 232 outputs data indicative of content of the operations (hereafter, operation content data) to the controller 210. In this way, a content of operations performed by the user is communicated to the controller 210.

Figure 2:
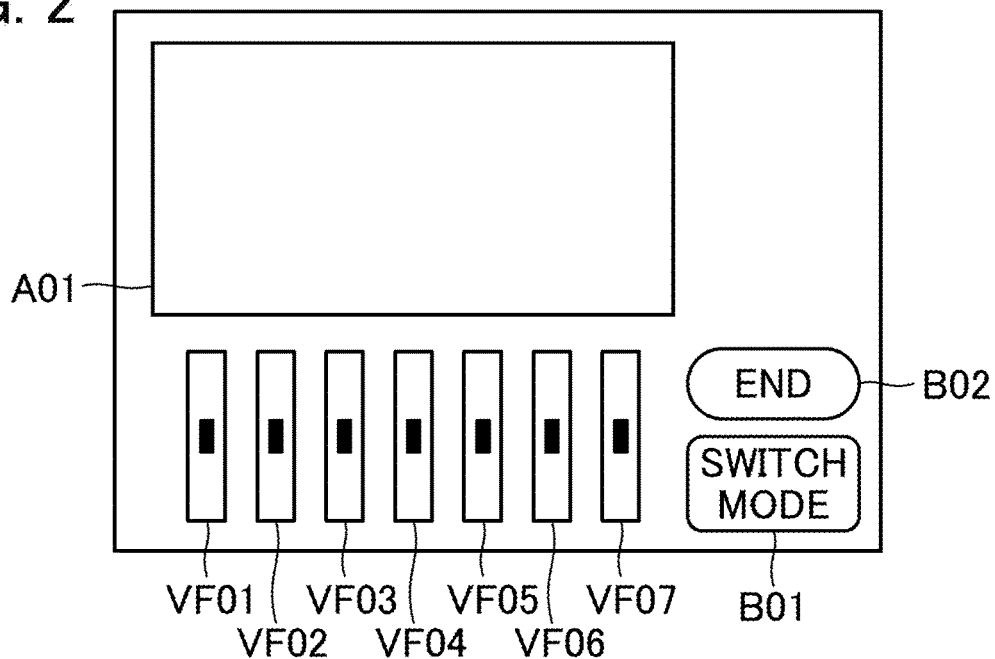
FIG. 2 shows an example of an adjustment support window displayed on a display 234 of a remote controller 20 of the frequency-characteristic adjuster 1.

The display 234 is a liquid crystal display and a device for driving the display, for example. Under control of the controller 210, the display 234 displays various images. Examples of images displayed by the display 234 under the control by the controller 210 include an image of an adjustment support window for supporting adjustment of frequency characteristics by the user. FIG. 2 is a diagram showing an exemplary adjustment support window displayed on the display 234. In the adjustment support window shown in FIG. 2, there are provided a characteristics display area A01 and virtual operating elements VF01 to VF07, B01, and B02.

In the characteristics display area A01, there are displayed a graph (line) representative of frequency characteristics for adjustment and a graph (line) representative of target characteristics, extending along a two-dimensional plane with a horizontal axis of frequency in a logarithmic scale and a vertical axis of amplitude in decibels (dBs). Each of the virtual operating elements VF01 to VF07 is a virtual fader that enables the user to set an adjustment amount for a frequency response (adjustment amount for each frequency component) for use in adjusting the frequency characteristics for adjustment toward the target characteristics. An overall display area including the characteristics display area A01 and an area displaying the virtual operating elements VF01 to VF07 can be regarded as a two-dimensional display area that shows frequency and gain. The virtual operating element B02 enables the user to instruct the frequency-characteristic adjuster 1 to terminate adjustment of frequency characteristics; and the virtual operating element B01 enables the user to instruct the frequency-characteristic adjuster 1 to switch between operation modes of the remote controller 20.

The frequency-characteristic adjuster 1 has two kinds of operation modes: a first operation mode and a second operation mode. The virtual operating element B01 enables the user to instruct the frequency-characteristic adjuster 1 to switch from the first operation mode to the second operation mode, or to switch from the second operation mode to the first operation mode. The first operation mode enables the user to set adjustment amounts based on a relationship between smoothed characteristics and target characteristics, where the smoothed characteristics represent a frequency spectrum envelope obtained by smoothing data indicative of the frequency characteristics for adjustment (frequency spectrum) at a predetermined degree of smoothness. The target characteristics represent a frequency spectrum envelope (target spectrum envelope) to be achieved by adjustment. One example of smoothing processing is low-pass filtering where an axis of frequency in a logarithmic scale is treated as a time axis in a linear scale. In this example, the higher a cut-off frequency of the low-pass filter is, the greater a degree of smoothness is. Use of the axis of frequency in a logarithmic scale enables the user to perform adjustment in a linear scale in a frequency direction. An example of simple low-pass filtering is, for example, processing performed to calculate moving averages of amplitudes. In such an example, the wider a width of movement is, the greater a degree of smoothness is. The frequency axis may be graphed as a linear scale in response to the user's instruction. In a case where the frequency axis is switched to a linear scale, smoothing processing may be low-pass filtering where the frequency axis is treated as a time axis as it is. By performing smoothing processing as described above, fine peaks and dips present in the frequency characteristics for adjustment are smoothed. In other words, a graph (a curve) formed by graphing the smoothed characteristics will be smoother than a graph of the frequency characteristics for adjustment. Reasons will be stated below why the user sets adjustment amounts by using the smoothed characteristics, instead of by using the frequency characteristics for adjustment. The axis of amplitude may also be set as switchable to a linear scale in response to the user's instruction.

As described above, even when there appear in the frequency characteristics for adjustment peaks and dips that are not present in the target characteristics, sound engineers may not necessarily wish to remove all of these peaks and dips, since doing so could result in a deterioration in sound quality. For this reason, generally, sound engineers prefer to view frequency characteristics at a relatively low resolution (or prefer to view approximate frequency characteristics) before adjustment. To meet this preference of sound engineers, the frequency characteristics for adjustment will show unnecessarily rapid fluctuations and fine characteristics. In view of the foregoing, in this embodiment, adjustment amounts can be set based on the relationship between the target characteristics and the smoothed characteristics obtained by smoothing (in other words, lowering resolution of) the frequency characteristics for adjustment.

In the first operation mode, there is displayed in the characteristics display area A01 an image (refer to FIG. 3A) obtained by plotting a graph G01 of a two-dot chain line representative of the smoothed characteristics and a graph G02 of a solid line representative of the target characteristics on a two-dimensional plane of coordinates, in which plane an axis of frequency in a logarithmic scale is set as a horizontal axis and an axis of amplitude in decibels is set as a vertical axis. In the example shown in FIG. 3A, flat frequency characteristics of zero dB are used as the target characteristics, and the graph G02 representative of the target characteristics overlaps the frequency axis. Since the target characteristics are flat frequency characteristics of zero dB in the example shown in FIG. 3A, the graph G01 may be regarded as showing differences between the target characteristics and the smoothed characteristics. Alternatively, as the target characteristics, there may be used other frequency characteristics, such as those that have greater attenuation with increasing frequency or those that have greater attenuation with decreasing frequency.

Here, "differences" between two sets of frequency characteristics means a difference, "$L1(f)-L2(f)$", between a graph or line $L1(f)$ in which one set of the frequency characteristics is expressed as a function of frequency f, and a graph or line $L2(f)$ in which the other set of the frequency characteristics is expressed as a function of frequency f. Accordingly, the "differences" are a function of frequency f.

Figure 3A:
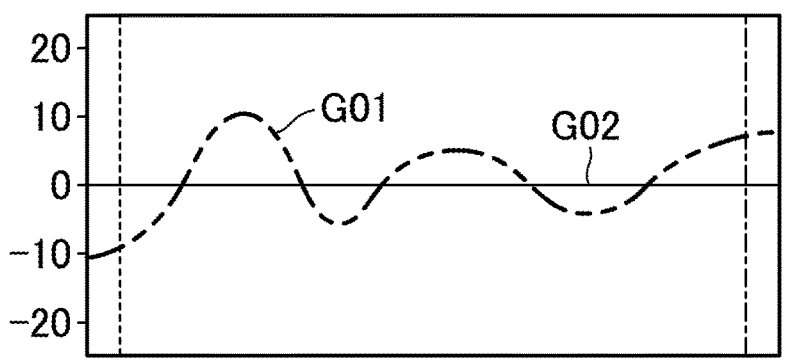
FIG. 3A shows an exemplary characteristics display area A01 displayed in the adjustment support window.

In this embodiment, a graph representative of the smoothed characteristics themselves is used as the graph G01 representative of the smoothed characteristics. Alternatively, instead of a graph representative of the smoothed characteristics, a graph may be used that represents inverse characteristics of the smoothed characteristics (a graph resulting from inverting a graph representative of the smoothed characteristics with respect to the frequency axis). In accordance with the user's instruction, a graph to be displayed may be switched between the graph of the smoothed characteristics as they are and the graph of the inverse characteristics of the smoothed characteristics. Depending on a preference of a sound engineer, the sound engineer may perform frequency characteristic adjustment by referring to the frequency characteristics as they are or may perform frequency characteristic adjustment by referring to the inverse characteristics of the frequency characteristics. Similarly, the target characteristics may be displayed as they are or inverse characteristics of the target characteristics may instead be displayed; or the display may be switchable so that the target characteristics are displayed dependent on the user's operation. In FIG. 3A, a line type used for drawing a graph of the smoothed characteristics is different from that for drawing a graph of the target characteristics, and thus, by differentiation of the line types, the user is able to see which of the graphs G01 and G02 represents the smoothed characteristics and which represents the target characteristics. Alternatively or additionally, the two graphs may be made distinguishable by their line colors. For example, the smoothed characteristics may be depicted by a blue line, while the target characteristics may be depicted by a line of a color other than blue (e.g., green or red).

Similarly to the technique disclosed in Patent Document 1, in this embodiment also, the user may specify a target frequency band (which may also be referred simply as a "frequency band") for which frequency characteristics are to be moved close to the target characteristics, in accordance with frequency bands that the loudspeaker 3 is capable of reproducing as sound. The user may specify a target frequency band by performing operations on images displayed in the characteristics display area A01. The dotted line in FIG. 3A corresponds to a lower limit frequency of the frequency band specified by the user; and the dot-and-dash line in FIG. 3A corresponds to an upper limit frequency of the frequency band.

The second operation mode enables the user to set adjustment amounts based on a relationship between two sets of smoothed characteristics, where a degree of smoothness differs between one set and another. For example, in a case where the above-mentioned low-pass filtering is used as the smoothing processing, the frequency-characteristic adjuster 1 in the second operation mode allows the user to set adjustment amounts based on a relationship between first smoothed characteristics and second smoothed characteristics. Here, the first smoothed characteristics are derived by setting the cut-off frequency at a predetermined value F0 (first degree of smoothness); and the second smoothed characteristics are derived by setting the cut-off frequency at a value F1 greater than the value F0 (a second degree of smoothness that is lower than the first degree of smoothness). The lower the cut-off frequency, the greater the degree of smoothness achieved by the low-pass filtering will be and the lower the resolution will be. In other words, in a graph or line obtained by graphing the second smoothed characteristics, there will appear fine peaks and dips that do not appear in a graph or line of the first smoothed characteristics. In this embodiment, the first set of smoothed characteristics (first smoothed characteristics) and the second set of smoothed characteristics (second smoothed characteristics) are separately generated; in other words, the first set of smoothed characteristics and the second set of smoothed characteristics are generated independently from each other.

For example, in the second operation mode in this embodiment, there is displayed in the characteristics display area A01 an image (refer to FIG. 3B) that is obtained by plotting a graph G01 of a two-dot chain line and a graph G03 of a dot-and-dash line on the two-dimensional plane of coordinates, where the graph G01 represents the first smoothed characteristics and the graph G03 represents the second smoothed characteristics. In the second operation mode, the user may select any of the fine peaks that appear in the second smoothed characteristics and do not appear in the first smoothed characteristics, and the user may set an adjustment amount for smoothing the selected peak. For example, by treating the smoothed characteristics generated in the first operation mode as the first smoothed characteristics in the second operation mode, adjustment amounts may be set in the second operation mode subsequent to the setting of the adjustment amounts in the first operation mode. In this way, adjustment may be performed in the second operation mode at a resolution higher than the resolution at which adjustment is performed in the first operation mode. For this reason, the second operation mode is provided in this embodiment in addition to the first operation mode. Each graph displayed in the second operation mode may be a graph representative of the first or second smoothed characteristics as they are, or a graph representative of inverse characteristics of the first or second smoothed characteristics. Additionally, the first smoothed characteristics and the second smoothed characteristics may be made distinguishable from each other by line colors used to draw the corresponding graphs, instead of by line types. Adjustment in the second operation mode may be performed without adjustment in the first operation mode. In such a case, the second smoothed characteristics are adjusted so as to be moved close to the first smoothed characteristics. In other words, in this case, the first smoothed characteristics may be regarded as representing a frequency spectrum envelope to be achieved by adjustment (as a target spectrum envelope).

The memory storage 240 includes a volatile storage 242 and a non-volatile storage 244. The volatile storage 242 is a RAM (random access memory), for example, and is used by the controller 210 as a work area when the controller 210 executes programs. The non-volatile storage 244 may be an EEPROM (electrically erasable programmable read-only memory) or a flash ROM (read only memory), for example. The non-volatile storage 244 stores the above-mentioned adjustment support program and a kernel program that enables the controller 210 to realize the OS (operating system).

After the power (illustration omitted in FIG. 1) of the remote controller 20 is turned on, the controller 210 reads the kernel program out from the non-volatile storage 244 into the volatile storage 242, and starts executing the kernel program. While the controller 210 is operating under execution of the kernel program to realize the OS, if the controller 210 is given an instruction to execute another program by an operation input to the operation inputter 232, the controller 210 reads the subject program out from the non-volatile storage 244 into the volatile storage 242 and executes the program. For example, when an instruction is given to execute the adjustment support program via the operation inputter 232, the controller 210 reads the adjustment support program out from the non-volatile storage 244 into the volatile storage 242 and executes the program.

The controller 210 operates either in the first operation mode or in the second operation mode under execution of the adjustment support program. In this embodiment, at the time of initiating execution of the adjustment support program, the controller 210 operates in the first operation mode, and thereafter, the operation mode in which the controller 210 operates is switched from one mode to the other each time the virtual operating element B01 is operated. For example, in a case where the virtual operating element B01 is operated while the controller 210 is operating in the first operation mode, the operation mode of the controller 210 is switched from the first operation mode to the second operation mode. Similarly, in a case where the virtual operating element B01 is operated while the controller 210 is operating in the second operation mode, the operation mode of the controller 210 is switched from the second operation mode to the first operation mode.

Figure 4:
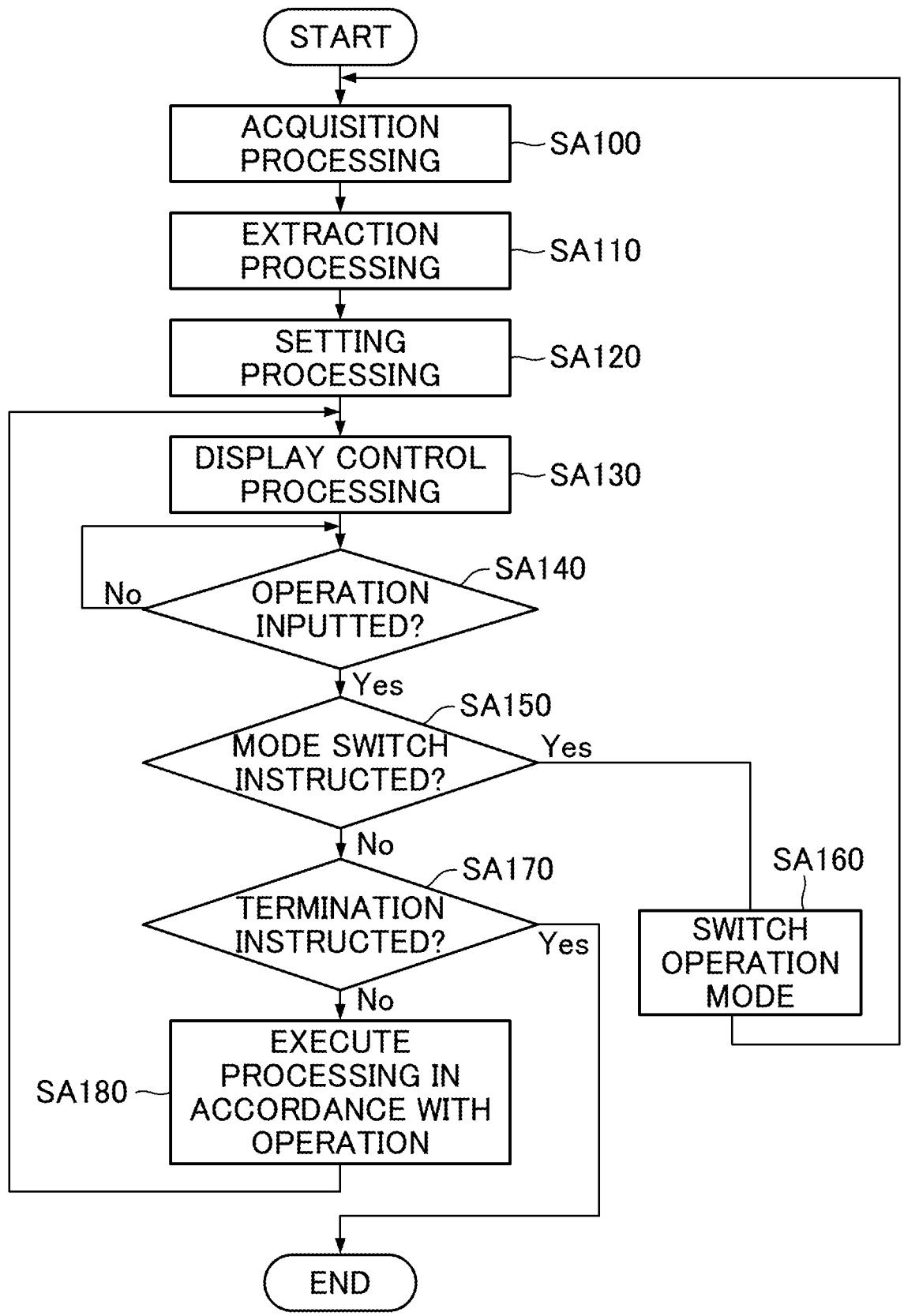
FIG. 4 is a flowchart showing a flow of operations performed by a controller 210 of the remote controller 20 in accordance with an adjustment support program.

Regardless of whether the controller 210 operates in the first operation mode or in the second operation mode, the controller 210 performs, under execution of the adjustment support program, each of the following operations in the order depicted in the flowchart shown in FIG. 4: acquisition processing, extraction processing, setting processing, display control processing, detection processing, intersection-frequency modify processing, and adjustment-amount update processing (refer to FIG. 1). The step SA180 in FIG. 4 includes the detection processing, the intersection-frequency modify processing, and the adjustment-amount update processing. Details of each processing in each of the first and the second operation modes are described below.

Operations performed in the acquisition processing differ between the first operation mode and the second operation mode. In the acquisition processing in the first operation mode, the controller 210 acquires smoothed characteristic data representative of the smoothed characteristics and target characteristic data representative of the target characteristics. In the acquisition processing in the second operation mode, the controller 210 acquires first smoothed characteristic data representative of the first smoothed characteristics and second smoothed characteristic data representative of the second smoothed characteristics. Here, each type of data, namely the smoothed characteristic data, the first smoothed characteristic data, and the second smoothed characteristic data, is acquired by smoothing the measured frequency characteristics of the sound reproduction system excluding filters. Accordingly, the acquisition processing may be processing in which the measured frequency characteristics are acquired and the acquired frequency characteristics are smoothed to calculate required smoothed characteristic data.

Acquisition of the smoothed characteristic data may be performed in various manners. In an exemplary manner, the main body 10 may perform smoothing processing and the resultant data may be acquired from the main body 10. In another exemplary manner, data representative of frequency characteristics measured by the main body 10 for the overall sound reproduction system may be acquired from the main body 10, and the controller 210 may perform smoothing processing on the acquired data to generate smoothed characteristic data. Acquisition of the target characteristic data may also be performed in various manners. In an exemplary manner, different types of target characteristic data are stored in the non-volatile storage 244 in advance, and the user may specify a type of target characteristic data representative of desired target characteristics. A manner of acquiring the first and the second smoothed characteristic data in the second operation mode may be the same as that of acquiring the smoothed characteristic data in the first operation mode.

In the extraction processing, there are extracted partial bands, where frequency characteristics for adjustment are adjusted toward the target characteristics by a unit of a partial band (i.e., a partial band serves as a unit of operation). The extraction processing divides into multiple partial bands the frequency band that covers the overall range of frequencies in which characteristics are to be adjusted toward the target characteristics. A partial band, which serves as a unit of operation, is a range of frequencies for which a collective adjustment amount used to adjust the frequency characteristics for adjustment toward the target characteristics is set (e.g., set by a single parameter). That is, a partial band corresponds to a smallest unit for setting an adjustment amount. Preferably, a width of a partial band is determined for ease of use by the user, who adjusts the frequency characteristics for adjustment toward the target characteristics, in recognizing and/or carrying out operations to make adjustments to partial bands.

In the extraction processing in the first operation mode in this embodiment, the controller 210 extracts, from the frequency band, sections during each of which the signs of differences between the smoothed characteristics and the target characteristics remain positive or negative (i.e., a section from an intersection between a graph of smoothed characteristics and a graph of target characteristics to a neighboring intersection; or a section sandwiched between two successive intersections), as partial bands, with each serving as an operation unit. In the extraction processing in the second operation mode, the controller 210 extracts, as partial bands, with each serving as an operation unit, sections during each of which the signs of differences between the first smoothed characteristics and the second smoothed characteristics remain positive or negative (i.e., a section from an intersection between a graph of the first smoothed characteristics and a graph of the second smoothed characteristics to a neighboring intersection; or a section between two successive intersections). In this way, similarly to a case in the first operation mode, partial bands, with each serving as an operation unit, are determined in the second operation mode in a way that enables the user to easily recognize and carry out operations to make adjustments to partial bands.

Figure 5A:
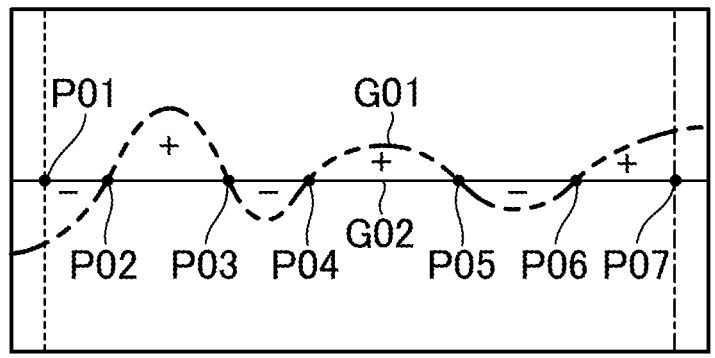
FIG. 5A shows an exemplary manner of extracting partial bands in extraction processing.

An exemplary case is assumed in which the controller 210 operates in the first operation mode, the smoothed characteristics are represented by the graph G01 in FIG. 5A, and the target characteristics are represented by the graph G02 in FIG. 5A. In FIG. 5A, a point P01 is a leftmost end (i.e., a lower limit) of a frequency band for which characteristics are adjusted toward target characteristics, and a point P07 is a rightmost end (i.e., an upper limit) of the frequency band. The graph G01 in FIG. 5A is the same as the graph G01 in FIG. 3A, and the graph G02 in FIG. 5A is the same as the graph G02 in FIG. 3A. Intersections P02 to P06 in FIG. 5A are intersections at which the graph G01 representative of the smoothed characteristics intersects the graph G02 representative of the target characteristics. Signs "+" and "−" in FIG. 5A denote differences between the smoothed characteristics and the target characteristics. In a case where the smoothed characteristics and the target characteristics have a relationship as shown in FIG. 5A, the controller 210 treats the points P01 and P07 as intersections between the graph of the smoothed characteristics and the graph of the target characteristics. The controller 210 divides the frequency band having the point P01 as its leftmost end and the point P07 as its rightmost end, into six partial bands, each partial band being defined by two neighboring intersections. The controller 210 then extracts each of these six partial bands as an operation unit. More specifically, the controller 210 extracts: a first partial band defined by the intersection P01 and the intersection P02 in FIG. 5A; a second partial band defined by the intersection P02 and the intersection P03; a third partial band defined by the intersection P03 and the intersection P04; a fourth partial band defined by the intersection P04 and the intersection P05; a fifth partial band defined by the intersection P05 and the intersection P06; and a sixth partial band defined by the intersection P06 and the intersection P07. As will be clear from FIG. 5A, the differences between the smoothed characteristics and the target characteristics remain negative in the first, third, and fifth partial bands; and the differences between the smoothed characteristics and the target characteristics remain positive in the second, fourth, and sixth partial bands.

Figure 3B:
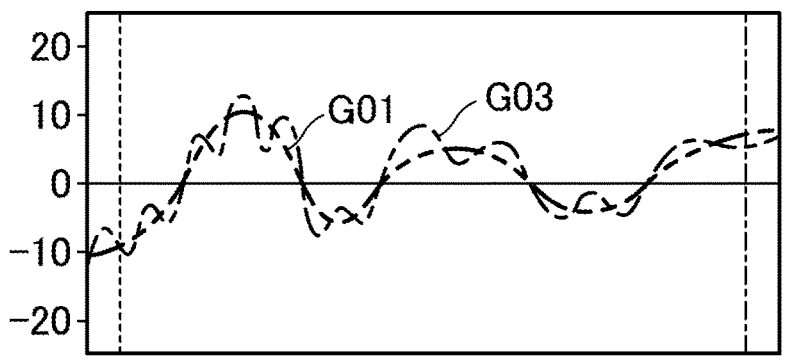
FIG. 3B shows an exemplary characteristics display area A01 displayed in the adjustment support window.
Figure 5B:
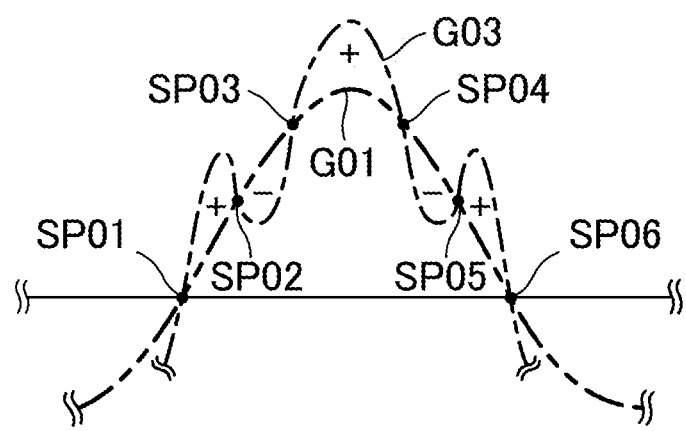
FIG. 5B shows an exemplary manner of extracting partial bands in the extraction processing.

Now, a case is assumed where the operation mode is switched to the second operation mode from the first operation mode described immediately above, and the first smoothed characteristics are represented by the graph G01 in FIG. 3B and the second smoothed characteristics are represented by the graph G03 in FIG. 3B. In this case, each partial band extracted in the extraction processing in the first operation mode is subdivided into partial bands that are finer than the extracted partial band. FIG. 5B is a graph showing a magnified view of the second partial band. In the example shown in FIG. 5B, the second partial band (a section between the intersections P02 and P03) in FIG. 5A is divided into subpartial bands, with each of the subpartial bands being defined by two neighboring intersections between the graph of the first smoothed characteristics and that of the second smoothed characteristics. More specifically, the second partial band is divided into: a first subpartial band defined by the intersection SP01 and the intersection SP02; a second subpartial band defined by the intersection SP02 and the intersection SP03; a third subpartial band defined by the intersection SP03 and the intersection SP04; a fourth subpartial band defined by the intersection SP04 and the intersection SP05; and a fifth subpartial band defined by the intersection SP05 and the intersection SP06. The intersection SP01 in FIG. 5B corresponds to the intersection P02 in FIG. 5A, and the intersection SP06 in FIG. 5B corresponds to the intersection P03 in FIG. 5A. As will be clear from FIG. 5B, the differences between the second smoothed characteristics and the first smoothed characteristics remain positive in the first, third, and fifth subpartial bands in FIG. 5B; and the differences between the second smoothed characteristics and the first smoothed characteristics remain negative in the second and fourth subpartial bands. In FIG. 5B, an example is shown where the second partial band is divided into five subpartial bands. However, the number of subpartial bands into which the second partial band is divided is not limited to five. Depending on an IR (impulse response) or setting parameters at the time, the second partial band may be divided into two subpartial bands or six or more (e.g., ten) subpartial bands. Similarly, the first and the third to the sixth partial bands may each be divided into multiple subpartial bands.

Operations performed in the setting processing do not differ between the first operation mode and the second operation mode. In the setting processing, the controller 210 sets the partial bands (or subpartial bands) extracted in the extraction processing as operation units for performing frequency characteristic adjustment.

Operations performed in the display control processing differ between the first operation mode and the second operation mode. In the display control processing in the first operation mode, the controller 210 displays a graph of the smoothed characteristics and a graph of the target characteristics in the characteristics display area A01. In the display control processing in the second operation mode, the controller 210 displays both a graph of the first smoothed characteristics and a graph of the second smoothed characteristics in the characteristics display area A01.

The user performs operations on the graphs, displayed in the characteristics display area A01 as described above, and sets a rate (as a percentage) of modification to be made to a shape that is representative of differences between the smoothed characteristics (the second smoothed characteristics in a case of the second operation mode) and the target characteristics (the first smoothed characteristics in a case of the second operation mode), as an adjustment amount for controlling a frequency response, where the rate being set for each partial band is set in the setting processing. The shape representative of differences is a shape of a region in a partial band that is enclosed by two neighboring intersections and the two lines (e.g., in the first operation mode, the graph G01 of the smoothed characteristics and the graph G02 of the target characteristics; in the second operation mode, the graph G03 of the second smoothed characteristics and the graph G01 of the first smoothed characteristics). In this way, by increasing/decreasing a single adjustment amount, the user is able to adjust frequency characteristics of a desired partial band (or subpartial band) toward the target characteristics, regardless of a shape of the smoothed characteristics in the partial band. Thus, the user need not perform cumbersome operations to set parameters such as center frequencies, Q values, and gains. A partial band to which an adjustment amount is set may be specified in various manners. For example, to specify a partial band for which frequency characteristics are to be adjusted in the first operation mode, the user may use a mouse to click on a freely-chosen position (this may be a position on a graph) inside a region corresponding to the partial band from among multiple regions enclosed by the graph G01 of the smoothed characteristics and the graph G02 of the target characteristics. The region corresponds to differences between the smoothed characteristics and the target characteristics and also corresponds to the partial band set in the setting processing. In order to assist the user in selection of a partial band, a manner of displaying regions enclosed by the graph G01 of the smoothed characteristics and the graph G02 of the target characteristics may be changed depending on whether a mouse cursor is positioned within the regions or not. For example, when the mouse cursor is positioned inside a region, the region may be highlighted; and when the mouse cursor is not positioned inside a region, the highlight may be removed from the region.

Adjustment amounts of frequency characteristics (frequency responses) of filters may also be set in various manners. For example, each of the virtual faders VF01 to VF07 may be associated with a corresponding one of the partial bands set in the setting processing, and the user may set adjustment amounts by operating the virtual faders VF01 to VF07. In this case, a virtual fader corresponding to a region in which the mouse cursor is positioned may be colored differently from other faders, or may be set to blink in synchronization with highlighting of the region.

Figure 6:
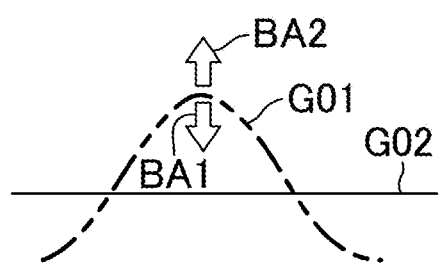
FIG. 6 shows an exemplary method for setting an adjustment amount.

In the first operation mode, the user may click on a freely-chosen position (e.g., a position near a peak) on the graph of the smoothed characteristics, within a partial band for which the user wishes to adjust frequency characteristics. The user may set an adjustment amount of frequency characteristics by performing an operation to move the graph close to, or away from, the target characteristics as shown by the arrow BA1 or BA2 in FIG. 6. In other words, an adjustment amount may be set in accordance with an amount of a mouse-dragging operation performed by the user to modify the shape of the graph of the smoothed characteristics. In this case, differences made to the graph before modification by the dragging operation relative to the graph after modification (modification amount in the graph of the smoothed characteristics) correspond to a frequency response of a filter. Alternatively, the user may set an adjustment amount of the frequency characteristics by an amount of a dragging operation by which the graph of the target characteristics is moved close to (or away from) the graph of the smoothed characteristics. In this case, differences in the graph of the target characteristics after modification by the dragging operation, relative to the graph before modification (modification amount in the graph of the target characteristics), correspond to a frequency response of a filter. In the following description, the latter approach, in which the graph of the target characteristics is modified, is used. The displayed frequency response corresponds to inverse characteristics. Accordingly, in partial bands in which the graph of the target characteristics is modified upward, sound signals will be attenuated by filters; and in partial bands in which the graph is modified downward, sound signals will be amplified by filters. Differences between the graph of the smoothed characteristics and the graph of the target characteristics correspond to frequency responses of filters in a case where the amount of modification in the graph of the target characteristics is 100%, that is, in a case where the smoothed characteristics are made to match the target characteristics (the smoothed characteristics are moved to become equal to the target characteristics). Similarly, in the second operation mode, an adjustment amount of frequency characteristics may be set in accordance with an amount of an operation performed by the user by which the graph of the first smoothed characteristics is moved close to (or away from) the graph of the second smoothed characteristics; or in accordance with an amount of an operation by which the graph of the second smoothed characteristics is moved close to (or away from) the graph of the first smoothed characteristics. In the former manner, the amount of modification in the graph of the first smoothed characteristics corresponds to a frequency response; and in the latter manner, the amount of modification in the graph of the second smoothed characteristics corresponds to a frequency response. In the following description, the former manner, in which the graph of the first smoothed characteristics is modified, is used. The displayed frequency response corresponds to inverse characteristics. Accordingly, in subpartial bands in which the graph of the first smoothed characteristics is modified upward, sound signals will be attenuated by filters; and in partial bands in which the graph is modified downward, sound signals will be amplified by filters. Differences between the graph of the first smoothed characteristics and the graph of the second smoothed characteristics correspond to frequency responses of filters in a case where the amount of modification in the graph of the first smoothed characteristics is 100%, that is, in a case where the second smoothed characteristics are made to match the first smoothed characteristics (the second smoothed characteristics are moved to become equal to the first smoothed characteristics).

Figure 7:
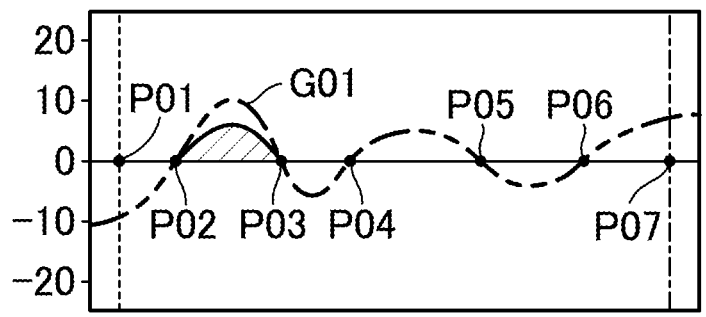
FIG. 7 shows an exemplary characteristics display area A01 displayed in a first operation mode after an adjustment amount has been set.

In the first operation mode, an adjustment amount for controlling a frequency response may be set as an amount of an operation or as a rate (percentage) set in accordance with the amount of the operation, the operation being performed by the user on a region enclosed by the graph of the smoothed characteristics and the graph of the target characteristics, where the region corresponds to differences between the smoothed characteristics and the target characteristics and corresponds to a partial band set in the setting processing. An example of such an operation performed by the user is clicking on a freely-chosen point within the region and dragging. An area in the region, corresponding to the adjustment amount, may be displayed in a distinctive manner to indicate to the user that the adjustment amount has been set or to indicate the adjustment amount to the user. For example, in a case where the graph of the target characteristics is modified by a dragging operation, as shown in FIG. 7, an area corresponding to the adjustment amount, relative to the target characteristics, is displayed with hatching (or displayed in a color different from those of other areas). Similarly, in the second operation mode, an adjustment amount for controlling a frequency response may be set as an amount of an operation or as a rate (percentage) set in accordance with the amount of the operation, the operation being performed by the user on a region enclosed by the graph of the first smoothed characteristics and the graph of the second smoothed characteristics, where the region corresponds to differences between the first smoothed characteristics and the second smoothed characteristics and corresponds to a partial band set in the setting processing. An area in the region corresponding to the adjustment amount may be displayed a distinctive manner. For example, in a case where the adjustment in the second operation mode is performed subsequent to the adjustment in the first operation mode, an area corresponding to the adjustment amount set in the second operation mode, relative to the first smoothed characteristics, may be displayed in a distinctive manner (e.g., displayed with hatching or displayed in a color different from those of other areas).

Figure 8:
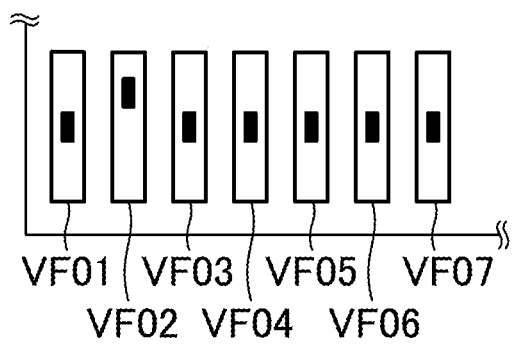
FIG. 8 is a diagram showing exemplary virtual faders VF01 to VF07 in the first operation mode after an adjustment amount has been set.

In a case where an adjustment amount is displayed as illustrated in FIG. 7, it is possible to recognize upon sight a current value of the adjustment amount of frequency characteristics and a relationship between the adjustment amount and the smoothed characteristics and/or the target characteristics, for each partial band. In a case where an adjustment amount is set that exceeds the smoothed characteristics in a partial band, an area corresponding to the exceeded amount may be displayed in a distinctive manner (e.g., displayed with hatching or in a particular color). In a case where an adjustment amount of frequency characteristics is set by an operation by which the graph is modified by mouse-dragging, if each of the virtual faders VF01 to VF07 is associated with a corresponding one of the partial bands set in the setting processing, a displayed position of a knob of the virtual fader corresponding to the partial band for which the adjustment amount has been set by the mouse-dragging operation may be changed in accordance with the set adjustment amount. For example, a case can be assumed where the partial band defined by the intersections P02 and P03 in FIG. 5A is associated with the virtual fader VF02. In this example, if the adjustment amount of the frequency characteristics for this partial band is set as shown in FIG. 7, displayed positions of the knobs of the virtual faders VF01 to VF07 will be changed as shown in FIG. 8. In this case, the displayed positions of the virtual faders VF01 to VF07, as a whole, represent frequency responses of filters used in the signal processing performed in accordance with correction parameters. In an example shown in FIG. 8, inverse characteristics of the frequency responses of the filters are displayed. Accordingly, at each of the virtual faders VF01 to VF07, as the displayed position of the knob goes upward, sound signals in the corresponding frequency band become more attenuated by the corresponding filter.

A maximum value and a minimum value for an adjustment amount of the frequency characteristics may be determined in advance for each partial band, and a value that can be set to the adjustment amount of the frequency characteristics may be limited within a range between the maximum and the minimum values. For example, in the first operation mode, in a partial band in which the graph of the smoothed characteristics is positioned higher than the graph of the target characteristics, the maximum and minimum values of the adjustment amount are appropriately set such that the range within which the graph in FIG. 7 can be modified by a dragging operation is limited to between the position of the graph of the smoothed characteristics, at a maximum, and the position of the graph of the target characteristics, at a minimum. In a partial band in which the graph of the target characteristics is positioned higher than the graph of the smoothed characteristics, the maximum and minimum values of the adjustment amount are appropriately set such that the range within which the graph can be modified is limited to between the position of the graph of the target characteristics, at a maximum, and the position of the graph of the smoothed characteristics, at a minimum. An initial value of the adjustment amount may be set to the minimum value (corresponding to the flat frequency response), and the user may drag the graph from its initial position corresponding to the initial value, thereby setting the adjustment amount of the frequency characteristics. In this case, the initial displayed positions of the knobs of the virtual faders VF01 to VF07 are at the zero-positions corresponding to the graph of the target characteristics shown in FIG. 7 before being modified by a dragging operation. In a case where a particular operating element not illustrated in the figure is operated after a partial band has been specified, the adjustment amount of the frequency characteristics in that partial band may be reset to a predetermined value (e.g., the maximum value or the minimum value).

In the description immediately above, there are given examples of an operation for specifying a partial band in which frequency characteristics are to be adjusted, and examples of operations for setting adjustment amounts. In addition to these operations, by mouse-dragging each graph (the graph of the smoothed characteristics or the target characteristics in the first operation mode, or the graph of the first or second smoothed characteristics in the second operation mode), the user may cause a parallel shift in the graph in the vertical-axis direction. Furthermore, by dragging each intersection between the two graphs, the user may move the intersection on the target graph in the frequency-axis direction, thereby modifying the other graph. In this way, when the user performs a modifying operation on the graph with respect to the smoothed characteristics, the target characteristics, the first smoothed characteristics, or the second smoothed characteristics, the corresponding graph also is modified Operations performed in the detection processing differ between the first operation mode and the second operation mode. In the detection processing in the first operation mode, the controller 210 detects user operations by which the smoothed characteristics, the target characteristics, or the smoothed characteristics and the target characteristics, are changed (i.e., modification is made to or a parallel shift is caused in the corresponding graph(s)). In the detection processing in the second operation mode, the controller 210 detects user operations by which the first smoothed characteristics, the second smoothed characteristics, or the first and second smoothed characteristics are changed.

The adjustment-amount update processing is executed when a user performs an operation that changes an adjustment amount of frequency characteristics in a partial band and when the operation is detected by detection means (controller 210). Operations performed in the adjustment-amount update processing do not differ between the first operation mode and the second operation mode. In the adjustment-amount update processing, the controller 210 updates a frequency response of a filter in accordance with the adjustment amount set for the partial band by the user. For example, in the first operation mode, the adjustment amount is a multiplication coefficient applied to differences between the smoothed characteristics and the target characteristics; and in the second operation mode, the adjustment amount is a multiplication coefficient applied to differences between the first smoothed characteristics and the second smoothed characteristics.

The intersection-frequency modify processing is executed when a move operation performed by the user for moving an intersection is detected. Operations performed in the intersection-frequency modify processing differ between the first operation mode and the second operation mode. In the intersection-frequency modify processing in the first operation mode, the controller 210 updates the smoothed characteristic data such that the graph of the smoothed characteristics intersects the graph of the target characteristics at the intersection having been moved, and such that the graph of the smoothed characteristic forms a smooth curve. In the intersection-frequency modify processing in the second operation mode, the controller 210 updates the second smoothed characteristic data such that the graph of the first smoothed characteristics intersects the graph of the second smoothed characteristics at the intersection having been moved, and such that the graph of the first smoothed characteristics forms a smooth curve. In both the first and second operation modes, widths of two partial bands each having an intersection as one of its ends are changed by the move operation by which the intersection is moved in a frequency direction. If an adjustment amount in either one of the two partial bands, for which the widths are changed, is not zero, then the adjustment-amount update processing is initiated, and the frequency responses of the filters are updated in accordance with the updated smoothed characteristic data.

As shown in FIG. 4, under execution of the adjustment support program, the controller 210 sequentially executes the acquisition processing, the extraction processing, the setting processing, and the display control processing (step SA100 to step SA130 in FIG. 4), and waits for the user's operation (step SA140). Once the user performs an operation at the operation inputter 232, the result of determination at step SA140 becomes "Yes" and the controller 210 executes step SA150 and subsequent processing.

At step SA150, the controller 210 determines whether switching of the operation mode has been instructed (i.e., whether the virtual operating element B01 has been clicked on). In a case where the result of determination at step SA150 is "Yes", the controller 210 switches the operation mode from one to the other (step SA160), and executes step SA100 and subsequent processing. In a case where the result of determination at step SA150 is "No", the controller 210 executes step SA170 and subsequent processing.

At step SA170, the controller 210 determines whether termination of processing has been instructed (i.e., whether the virtual operating element B02 has been clicked on). In a case where the result of determination at step SA170 is "Yes", the controller 210 causes the display 234 to erase the adjustment support window, and terminates the execution of the adjustment support program. In a case where the result of determination at step SA170 is "No", the controller 210 executes processing in accordance with the received operation (step SA180), and again executes step SA130 and subsequent processing.

Details of the processing executed at step SA180 are as follows. For example, in a case where the user performs an operation to select a partial band and change an adjustment amount of frequency characteristics in the partial band, the controller 210 changes the adjustment amount in the partial band in accordance with the amount of the operation in step SA180. In the display control processing at step SA130 executed subsequent to step SA180, the changed adjustment amount is displayed with hatching.

In a case where the user performs an operation for moving an intersection, the controller 210 executes at step SA180 the intersection-frequency modify processing described above. In a case where an adjustment amount of frequency characteristics has been set to any partial band at the time the operation for moving an intersection is performed, the controller 210 executes the detection processing and the adjustment-amount update processing, in addition to the intersection-frequency modify processing.

In a case where an operation is performed to cause a parallel shift in a graph in the vertical axis direction after an adjustment amount of frequency characteristics has been set to any partial band, the controller 210 executes the detection processing and the adjustment-amount update processing at step SA180.

So far, description has been given of the configuration of the frequency-characteristic adjuster 1.

Operations

Next, description will be given of operations of the remote controller 20 along with steps for adjusting frequency characteristics with use of the frequency-characteristic adjuster 1. The user of the frequency-characteristic adjuster 1 first measures frequency characteristics for adjustment in a manner described above. Having completed measurement of the frequency characteristics for adjustment, the user performs an operation at the operation inputter 232 to provide an instruction to execute the adjustment support program, and the controller 210 executes the adjustment support program in accordance with the instruction.

At the time the adjustment support program is initiated, the operation mode is set to the first operation mode. Accordingly, the controller 210 executes the acquisition processing, the extraction processing, the setting processing, and the display control processing in the first operation mode (steps SA100 to SA130 in FIG. 4). As a result, there is displayed on the display 234 the adjustment support window (refer to FIG. 2) in which an image as shown in FIG. 3A is framed in the characteristics display area A01. In this state, the controller 210 waits for the user's operation (step SA140 in FIG. 4).

Having observed the adjustment support window in the state described immediately above, the user operates the operation inputter 232 to select a partial band in which frequency characteristics are to be adjusted and to set an adjustment amount of the frequency characteristics. For example, an exemplary case is assumed in which the user has specified a partial band defined by the intersections P02 and P03, and the user has performed an operation by which the height of a peak present in the smoothed characteristics is lowered by 50% (i.e., the graph of the target characteristics in FIG. 7 is mouse-dragged upward such that the adjustment amount for the partial band is set to 50%). When such an operation has been performed by the user, the result of determination at step SA140 becomes "Yes", and the controller 210 executes step SA150 and subsequent processing.

The operation performed by the user in this example is neither an instruction to switch the operation mode nor an instruction to terminate processing. The results of determination at step SA150 and at step SA170 are both "No", and accordingly, processing at step SA180 is executed. In this example, since an operation has been performed by which the peak is lowered to half its original height for the partial band defined by the intersections P02 and P03, there is set for the whole of the partial band a single adjustment amount corresponding to 50% of the current amplitude. Details are as follows. It is assumed that an amplitude value before the operation was performed is A(f) at a frequency f within a frequency band ranging from the frequency f1 at the leftmost end to the frequency fr at the rightmost end in the partial band (i.e., f1≤f≤fr). In such a case, there is set by the above operation a frequency response of a filter that attenuates all of the frequencies between the frequency f1 and the frequency fr such that the amplitude values of the frequency characteristics for adjustment are set to "0.5×A(f)". In other words, the frequency response for the partial band is set to a value corresponding to products resulting from multiplying the difference between the smoothed characteristics and the target characteristics by the adjustment amount of all of these frequencies. At step SA130 subsequent to step SA180, the frequency response corresponding to the adjustment amount set by the user is displayed with hatching, as shown in FIG. 7, in the characteristics display area A01 along with the graph G01 representative of the smoothed characteristics and the graph G02 representative of the target characteristics.

Figure 9A:
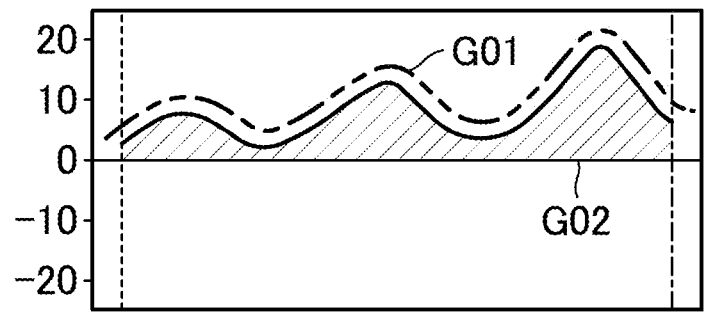
FIG. 9A shows an exemplary characteristics display area A01 in a case where an operation has been performed to cause a parallel shift in a graph G01 representative of smoothed characteristics in the first operation mode.
Figure 9B:
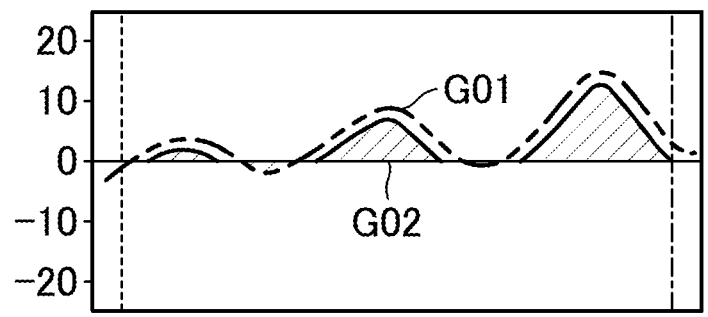
FIG. 9B shows an exemplary characteristics display area A01 in a case where an operation has been performed to cause a parallel shift in a graph G01 representative of smoothed characteristics in the first operation mode.

It is assumed that the graph G01 representative of the smoothed characteristics is modified as shown in FIG. 9A by an operation subsequently performed by the user, and that a single adjustment amount having a value corresponding to 80% of the original value is set for the entire frequency band. In such a state, the user may perform an operation by which a parallel downward shift is caused in the graph G01 of the smoothed characteristics as shown in FIG. 9B. That is, the entire graph is moved downward without changing its shape (the shape of the curve). In other words, all the values represented by the graph are decreased by the same amount (by the same value). In such a case, at step SA180, the detection processing and the adjustment-amount update processing are executed. In the example shown in FIG. 9A, the smoothed characteristics are higher than the target characteristics for the entire frequency band. When a state shown in FIG. 9A is changed to a state shown in FIG. 9B by a parallel downward shift in the graph G01 of the smoothed characteristics, the graph G01 of the smoothed characteristics intersects the graph G02 of the target characteristics, resulting in multiple partial bands. In some of the resultant partial bands, the smoothed characteristics are lower than the target characteristics. In the adjustment-amount update processing, an adjustment amount is prepared for each partial band. Adjustment amounts for partial bands, in which the shifted graph G01 of the smoothed characteristics is higher than the graph G02 of the target characteristics, are set to the same value as the single adjustment amount (80%) before the parallel shift. Frequency responses for those partial bands of the filters are updated to values in accordance with products resulting from multiplying the differences between the parallel-shifted smoothed characteristics and the target characteristics (zero dB in the example shown in FIG. 9B) within these partial bands by the adjustment amount. Adjustment amounts for other partial bands, in which the shifted graph G01 of the smoothed characteristics is lower than the graph G02 of the target characteristics, may be set to the value (80%), which is the same as the adjustment amount before the parallel shift, so as to set their frequency responses in accordance with the adjustment amounts and the differences between the shifted smoothed characteristics and the target characteristics. Alternatively, the initial values for the adjustment amounts for these partial bands may be set to zero, so as to set flat frequency responses for these partial bands. In this embodiment, the former manner is used. At step SA130 subsequent to step SA180, the updating performed in step SA180 is reflected in displayed content. More specifically, in accordance with the adjustment amount for each partial band that has been prepared and updated in the adjustment-amount update processing, the controller 210 displays a frequency response of the partial band with hatching, as described above. As a result, content displayed in the characteristics display area A01 is updated to an image as shown in FIG. 9B.

Figure 10:
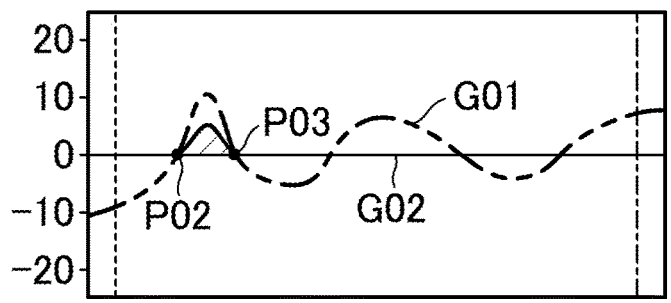
FIG. 10 shows an exemplary characteristics display area A01 in a case where an intersection P03 is moved to a lower-band side in the first operation mode.

It is assumed that the user thereafter performs an operation by which the smoothed characteristics and the adjustment amount are reset to the state shown in FIG. 7, and the user then performs an operation by which the intersection P03 is moved to a lower-band side. In such a case, at step SA180, there are executed the intersection-frequency modify processing, the detection processing, and the adjustment-amount update processing. More specifically, in the intersection-frequency modify processing, the smoothed characteristics are updated such that the graph G01 of the smoothed characteristics intersects the graph G02 of the target characteristics at the intersection P03 after being moved, and such that the graph G01 forms a smooth curve. The changes in the smoothed characteristics are detected in the detection processing, and upon detecting the changes, the adjustment-amount update processing is executed. In the adjustment-amount update processing, the value of the adjustment amount (50%) set to the partial band defined by the intersection P02 and the original intersection P03 before being moved is used as the adjustment amount for the partial band defined by the intersection P02 and the intersection P03 after being moved. As the frequency response of this partial band, there is calculated a product resulting from multiplying the differences between the changed smoothed characteristics and the target characteristics by the adjustment amount. As a result, content displayed in the characteristics display area A01 is updated to an image illustrated in FIG. 10.

After adjustment amounts of frequency characteristics are roughly set based on their relationship with the target characteristics, the user clicks on the virtual operating element B01 in order to finely set the adjustment amounts of the frequency characteristics. Upon the clicking operation being performed by the user, the result of determination at step SA140 becomes "Yes", and the controller 210 executes step SA150 and subsequent processing. Since the operation performed by the user consists of clicking on the virtual operating element B01, the result of determination at step SA150 becomes "Yes" and processing at step SA160 is now executed. At step SA160, the controller 210 switches the operation mode of the remote controller 20 from the first operation mode to the second operation mode, and again executes step SA100 and subsequent processing.

Figure 11:
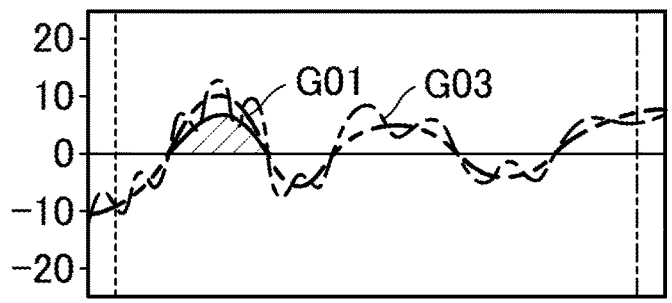
FIG. 11 shows an exemplary characteristics display area A01 in a second operation mode.

For example, it is assumed that the user has clicked on the virtual operating element B01 after an adjustment amount had been set, as shown in FIG. 7. In such a case, the display 234 of the remote controller 20 displays the adjustment support window in which an image illustrated in FIG. 11 is framed in the characteristics display area A01, and the controller 210 waits for the user's operation in this state (step SA140 in FIG. 4). The image shown in FIG. 11 differs from that shown in FIG. 3B in that the adjustment amount set in the first operation mode is displayed with hatching.

Figure 12A:
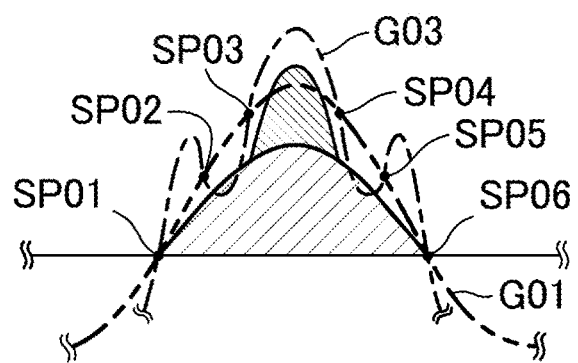
FIG. 12A shows an exemplary setting of an adjustment amount in the second operation mode.
Figure 12B:
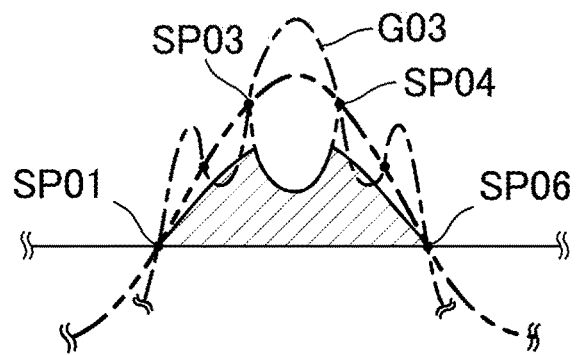
FIG. 12B shows an exemplary setting of the adjustment amount in the second operation mode.

Thereafter, the user may perform various operations, similar to those performed in the first operation mode, to finely set an adjustment amount of frequency characteristics. Such various operations may include: an operation by which a partial band is selected, for which band frequency characteristics are adjusted based on a relationship between sets of smoothed characteristics having different degrees of smoothness (i.e., first and second smoothed characteristics); an operation by which the adjustment amount for the selected partial band is set; an operation by which an intersection is moved in the frequency-axis direction, the intersection being between the graph G01 representative of the first smoothed characteristics and the graph G03 representative of the second smoothed characteristics; and an operation by which a parallel shift in the vertical axis direction is caused in each of the graphs of the first and the second smoothed characteristics. For example, operations may be performed by which the subpartial band defined by the intersection SP03 and the intersection SP04 (refer to FIG. 5B) is selected and by which the corresponding adjustment amount is changed upward or downward. By use of such operations, as shown in FIG. 12A or in FIG. 12B, an adjustment amount of frequency characteristics in a subpartial band present between the intersections SP01 and SP06 may be finely set. After the adjustment amount setting in the second operation mode is performed subsequent to the adjustment amount setting in the first operation mode, the final frequency responses of the filters are determined by taking into consideration both adjustment amounts set to partial bands in the first operation mode and adjustment amounts set to subpartial bands in the second operation mode. An exemplary manner for considering adjustment amounts set in the first operation mode and those set in the second operation mode may be as follows. For example, on a decibel scale, frequency responses set in accordance with the adjustment amounts for partial bands in the first operation mode are calculated independently from frequency responses set in accordance with the adjustment amounts for subpartial bands in the second operation mode. Then, the final frequency responses may be calculated by adding these independently calculated frequency responses.

Described above are steps for adjusting frequency characteristics in the present embodiment.

Based on the frequency responses of filters calculated in accordance with the adjustment amounts set for the partial bands or subpartial bands in a manner described above, the controller 210 calculates correction parameters (FIR filter coefficients) corresponding to the frequency responses and provides the calculated parameters to the main body 10. Here, the correction parameters may be calculated from the frequency responses by a method using an inverse Fourier transform, as in the technique disclosed in Patent Document 1, or by a method disclosed in Patent Document 2. The main body 10 performs signal processing on sound signals provided by the source device 5 in accordance with the correction parameters (e.g., FIR filter coefficients; that is, impulse response), and outputs the processed signals to the loudspeaker 3. In this way, frequency characteristics for adjustment are moved close to the target characteristics.

As described above, in the present embodiment, the user of the frequency-characteristic adjuster 1 is able to adjust frequency characteristics for adjustment toward the target characteristics with respect to a specified partial band alone. Furthermore, in this embodiment, easy and intuitive GUI-based operations enable the user to specify a partial band to be adjusted and to set an adjustment amount of frequency characteristics in that partial band. In short, a technique of the present disclosure enables a user to adjust frequency characteristics for adjustment toward the target characteristics in the specified partial band alone, and also enables the user to achieve such adjustments by using easy and intuitive operations. For example, the user is able to easily perform an adjustment for selectively removing peaks, from among peaks and dips appearing in smoothed frequency characteristics, and which cause acoustic feedback or coloration of sound. Depending on the user's preference, the frequency-characteristic adjuster 1 in the present embodiment may be used for adjustment in which the frequency characteristics are moved close to, but not made the same as the target characteristics; or for adjustment in which at least a part of the frequency characteristics are moved away from the target characteristics. With such uses, an advantage remains in that frequency characteristics can be easily adjusted.

Modifications

In the above description, an embodiment of the present disclosure has been described. The embodiment may be modified in the following manners.

(1) In the above embodiment, the remote controller 20 is a laptop or desktop personal computer. Alternatively, the remote controller 20 may be a so-called tablet terminal. In such a case, the user interface 230 may be formed of a touch sensor, such as a transparent pressure-sensitive sensor sheet, disposed to cover the display of the tablet terminal and the surface of the display. The touch sensor serves as the operation inputter 232.

(2) In the above embodiment, virtual operating elements (virtual faders) are used as operating elements for enabling the user to set adjustment amounts of frequency characteristics in partial bands. Alternatively, physical operating elements, such as hardware faders, may be used as the operating elements.

(3) In the above embodiment, an exemplary usage is described by which the user is able to adjust frequency characteristics for adjustment toward the target characteristics after the frequency characteristics have been measured. This usage is preferable in that, since smoothed characteristics are used that are obtained by smoothing frequency characteristics fixed at a time of measurement, the smoothed characteristics are not changed by the frequency response adjustment performed by the user, thus facilitating ease of adjustment. There may be a case where changes have been made to characteristics of the sound reproduction system excluding filters due to such factors as changes in positions of structural objects in the sound space 2, an increase or decrease in an audience size, changes in humidity or temperature, or replacement of the loudspeaker 3. In such a case, frequency characteristics of the sound reproduction system excluding filters may be measured, in response to the user's operation to instruct such measurement, and the graph of the smoothed characteristics may be changed in accordance with the newly measured frequency characteristics. Instead of using the smoothed characteristics obtained by smoothing frequency characteristics measured at the site, there may be used smoothed characteristics obtained by smoothing a set of frequency characteristics selected by the user from among multiple sets of frequency characteristics measured in the past. Similarly, there may be used target characteristics that have been changed in accordance with a modifying operation performed by the user; or the graph of the target characteristics may be changed by using a set of target characteristics selected from among multiple sets of target characteristics in accordance with a selection operation performed by the user. Furthermore, as candidates of the target characteristics, there may be used envelopes of frequency responses measured in different halls, or envelopes of frequency responses measured in the same hall but under different conditions (e.g., different audience sizes and/or different sets of stage equipment). By selecting a frequency response from among these frequency responses measured in the past and by using an envelope of the selected frequency response as the target characteristics, the user is able to adjust the frequency response in the subject hall toward the selected frequency response measured in the past.

The measurement of frequency characteristics to be adjusted and the adjustment of the frequency characteristics toward the target characteristics may be executed in a parallel manner on the time axis. More specifically, while frequency characteristics for adjustment are being measured, frequency-characteristic adjuster 1 displays in real time smoothed characteristics in accordance with the measured frequency characteristics. Thus, the graph of the smoothed characteristics displayed in the characteristics display area A01 is updated in real time. In a case where adjustment amounts of frequency characteristics have been already set, the adjustment amounts may be updated as the graph of the smoothed characteristics changes, and hatching applied to the adjustment amounts on the display may be updated as the adjustment amounts are updated. Then, when a predetermined operation (e.g., pressing a predetermined operating element) is performed by the user, data of the smoothed characteristics at that time are stored and updating of the graph can be terminated.

(4) In the above embodiment, in a case where an operation is performed by which there is caused a parallel shift in the vertical axis direction in the graph of the smoothed characteristics after an adjustment amount of frequency characteristics has been set to any of the partial bands, an updated adjustment amount after the graph shift will have a value of the adjustment amount that had been set to the partial band before the graph shift. In a case where multiple partial bands, to which different values of adjustment amounts have been set, are to be joined together to form a single partial band, along with the vertical parallel shift in the graph of the smoothed characteristics, an adjustment amount of the single partial band may be calculated in accordance with a statistical value (e.g., a mean, a median, a value that appears most frequently, a maximum value, or a minimum value) of the adjustment amounts that had been set to the partial bands before the graph shift.

(5) In the above embodiment, description is given of a frequency-characteristic adjuster that is switchable between the first operation mode and the second operation mode. Alternatively, there may be provided a frequency-characteristic adjuster that operates in only one of these operation modes. In the second operation mode, a value of the first degree of smoothness and a value of the second degree of smoothness, which is smaller than the value of the first degree of smoothness, may each be changed freely and processing may be repeated for each combination of these values. In the above embodiment, a single apparatus performs the setting of partial bands, which serve as operation units when frequency characteristics are adjusted, and performs the setting of adjustment amounts of frequency characteristics. In another embodiment, separate apparatuses may perform these procedures.

(6) Typical examples of a range equal to or lower than the lower limit frequency (first range; hereafter, may be referred to as the "low-side outside range") and a range equal to or higher than the upper limit frequency (second range; hereafter, may be referred to as the "high-side outside range") in the frequency band specified by the user, are ranges outside of the sound-reproducible bands in which sensitivity of the loudspeaker 3 drops. Accordingly, even if adjustment amounts are set, effects of corrections achieved by filtering will be small around the low-side outside range and also around the high-side outside range. If the amount of corrections by filtering is set to be unnaturally large, various adverse effects will result. In view of the above circumstances, adjustment may be performed using smoothed characteristics that have been edited (hereafter, may simply referred to as "edited smoothed characteristics") in a manner by which the smoothed characteristics match the target characteristics in at least one of the low-side outside range or the high-side outside range.

Figure 13A:
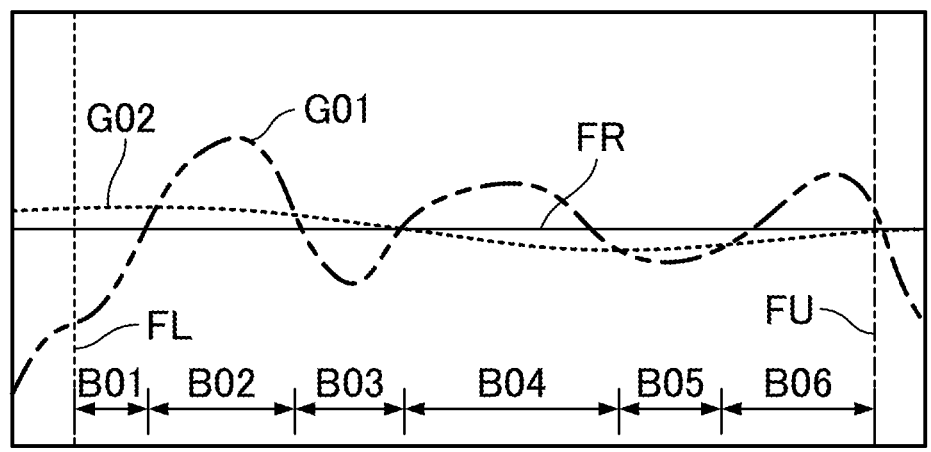
FIG. 13A shows exemplary smoothed characteristics that are not edited in a range equal to or lower than a lower limit frequency, and in a range equal to or higher than an upper limit frequency of a frequency band.
Figure 13B:
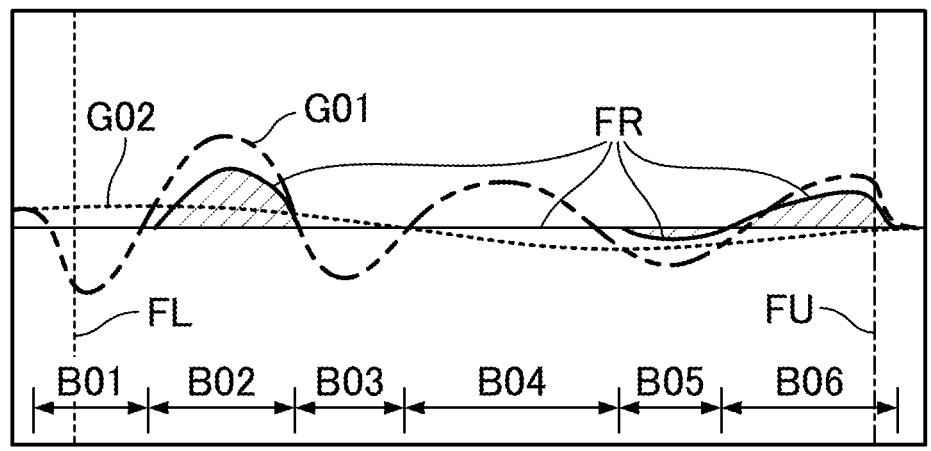
FIG. 13B shows exemplary smoothed characteristics that are edited in the range equal to or lower than the lower limit frequency, and in the range equal to or higher than the upper limit frequency of the frequency band.

With reference to FIG. 13A and FIG. 13B, an exemplary case is described. FIG. 13A and FIG. 13B are display examples of the graph G01 representative of the smoothed characteristics, the graph G02 representative of the target characteristics, and a line FR representative of frequency responses of filters. The dotted line FL and the dot-and-dash line FU indicate respectively a lower limit frequency and an upper limit frequency of a frequency band specified by the user. In this example, the graph G02 that deviates from the flat line of zero dB represents the target characteristics.

In FIG. 13A, the graph G01 that has not been edited represents the smoothed characteristics, and the original flat line FR (at zero dB, without amplification or attenuation) represents frequency responses of filters. The frequency band is divided into partial bands B01 to B06. In FIG. 13A, a lower limit frequency of the partial band B01, which is positioned in the lowest frequencies, is equal to the lower limit frequency of the subject frequency band, and an upper limit frequency of the partial band B06, which is positioned in the highest frequencies, is equal to the upper limit frequency of the subject frequency band.

In FIG. 13B, the graph G01 of smoothed characteristics having been edited is shown. For the graph G01 representative of the edited smoothed characteristics, a graph is preferably displayed that smoothly joins the graph G02 of the target characteristics in at least one of the low-side outside range or the high-side outside range.

As shown in FIG. 13B, when the edited smoothed characteristics are used, the lower limit frequency of the partial band B01, which is positioned in the lowest frequencies, may be set unequal to the lower limit frequency specified by the user, and set equal to a frequency at which the graph G01 of the edited smoothed characteristics joins the graph G02 of the target characteristics at the lower limit side. The upper limit frequency of the partial band B06, which is positioned in the highest frequencies, may be set unequal to the upper limit frequency specified by the user, and set equal to a frequency at which the graph G01 of the edited smoothed characteristics joins the graph G02 of the target characteristics at the upper limit side. In such cases, the partial band B01 may spread out of the lower limit frequency toward the low frequency side, and the partial band B06 may spread out of the upper limit frequency toward the high frequency side. Accordingly, the frequency band specified by the user serves as a rough indication of the frequency band that actually is to be adjusted.

In FIG. 13B, there is shown as frequency responses of filters an adjusted line FR that has been modified from the original flat line. In this example, inverse characteristics of the frequency responses of the filters are shown, and the adjustment is performed where sound signals in the partial bands B02 and B06 are attenuated and those in the partial band B05 are amplified.

With use of the edited smoothed characteristics, differences between the smoothed characteristics and the target characteristics will be small in at least one of the low-side outside range or the high-side outside range. Accordingly, excessive filter adjustment in either of these ranges is avoided. Furthermore, simply by looking at the displayed graph G01 of the smoothed characteristics, the user is able to see that characteristics in at least one of these ranges are excluded from characteristics to be controlled by the filters.

(7) An "intersection" between sets of frequency characteristics, that is, an "intersection" between graphs (lines) representative of frequency characteristics may be a point at which the graphs intersect with each other, and/or may be a point at which the graphs contact each other. In other words, an "intersection" is a point at which graphs overlap (a common point through which the graphs pass).

Second Embodiment

Next, description will be given of a frequency-characteristic adjuster 1 according to a second embodiment. Here, the description mainly refers to differences between the first embodiment and the second embodiment. The frequency-characteristic adjuster 1 of the second embodiment may operate in a third operation mode, other than the first operation mode or the second operation mode described in the first embodiment. As the virtual operating element B01 used for switching between the operation modes, there is used an operating element by which the operation mode is switched between the first, the second, and the third operation modes, instead of the operating element described in the first embodiment by which the operation mode is switched between the first and the second operation modes. The virtual operating element B01 may be realized in any way.

Figure 14:
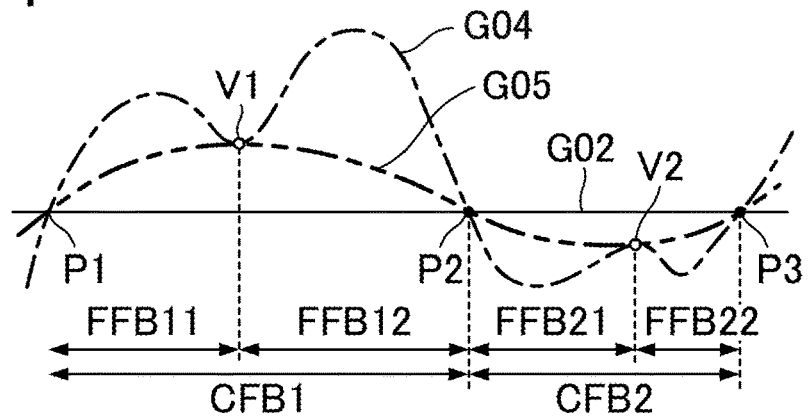
FIG. 14 shows an exemplary characteristics display area A01 displayed in a third operation mode.

Description will be given of the third operation mode. In the third operation mode, there are displayed in the characteristics display area A01 a graph (line) G02 representative of the target characteristics, a graph (line) G04 representative of the smoothed characteristics, and a graph (line) G05 representative of minimum smoothed characteristics. FIG. 14 shows a display example of the graph G02 representative of the target characteristics, the graph G04 representative of the smoothed characteristics, and the graph G05 representative of the minimum smoothed characteristics. In FIG. 14, a part of the whole frequency band is shown. The graph G02, the graph G04, and the graph G05 are respectively illustrated with a solid line, a dot-and-dash line, and a two-dot chain line.

The target characteristics may be flat frequency characteristics of zero dB, for example. Any other shape of frequency characteristics may be used as the target characteristics. The smoothed characteristics are obtained by smoothing frequency characteristics of the sound reproduction system excluding the measured filters, as described above. Frequencies at which the graph G02 of the target characteristics intersects the graph G04 of the smoothed characteristics define coarse partial bands as partial bands. In the part of the frequency band illustrated in FIG. 14, coarse partial bands CFB1 and CFB2 are defined as partial bands by frequencies corresponding to the intersections P1, P2, and P3, at each of which the graph G02 of the target characteristics intersects the graph G04 of the smoothed characteristics.

The degree of smoothness used in smoothing the smoothed characteristics in the third operation mode is preferably set to a relatively small value, around the degree of smoothness used in the second operation mode, so that fine peaks and fine dips are not removed in the smoothing process. In each coarse partial band, a point at which differences between the graph G02 of the target characteristics and the graph G04 of the smoothed characteristics reach at the minimum is referred to as a "turning point". In other words, in each coarse partial band, a position on the graph G04 of the smoothed characteristics, the position corresponding to the frequency at which differences between the graph G02 of the target characteristics and the graph G04 of the smoothed characteristics are at the minimum, is referred to as a "turning point". The differences between the graph G02 and the graph G04 are a function of frequency. In the part of the frequency band shown in FIG. 14, there exists a turning point V1 in the coarse partial band CFB1 and a turning point V2 in the coarse partial band CFB2. However, the number of turning points present in each coarse partial band is not limited to one; there may be no (zero) turning points or there may be two or more turning points.

The minimum smoothed characteristics are frequency characteristics defined by the graph G05 that is formed by smoothly connecting intersections between the graph G02 of the target characteristics and the graph G04 of the smoothed characteristics and turning points (minimum points) in differences between the graph G02 and the graph G04. The minimum smoothed characteristics may be defined such that they match the smoothed characteristics in coarse partial bands in which there are no turning points. In the part of the frequency band shown in FIG. 14, the minimum smoothed characteristics are defined by a graph formed by smoothly connecting the intersection P1, the turning point V1, the intersection P2, the turning point V2, and the intersection P3.

Frequencies at which the graph G02 of the target characteristics intersects the graph G04 of the smoothed characteristics and frequencies corresponding to turning points in the differences between the graph G02 and the graph G04 define fine partial bands as partial bands. In the part of the frequency band shown in FIG. 14, fine partial bands FFB11, FFB12, FFB21, and FFB 22 are defined as partial bands by frequencies corresponding to the intersection P1, the turning point V1, the intersection P2, the turning point V2, and the intersection P3.

Fine partial bands may be obtained by dividing a coarse partial band at frequencies corresponding to points at which the graph G04 of the smoothed characteristics contacts the graph G05 of the minimum characteristics. In other words, fine partial bands may be obtained by dividing a coarse partial band at frequencies corresponding to turning points in differences between the graph G02 of the target characteristics and the graph G04 of the smoothed characteristics. In the part of the frequency band shown in FIG. 14, the fine partial bands FFB11 and FFB12 are obtained by dividing the coarse partial band CFB1 at the frequency corresponding to the turning point V1. The fine partial bands FFB21 and FFB22 are obtained by dividing the coarse partial band CFB2 at the frequency corresponding to the turning point V2.

In the third operation mode, the user performs both a coarse adjustment operation and a fine adjustment operation. In the coarse adjustment operation, a coarse partial band serves as a unit of operation for setting an adjustment amount. The user specifies a coarse partial band for which an adjustment amount is to be set, and adjusts an adjustment amount indicative of a rate of adjustment applied to differences between the target characteristics (G02) and the minimum smoothed characteristics (G05) within the specified coarse partial band.

Figure 15:
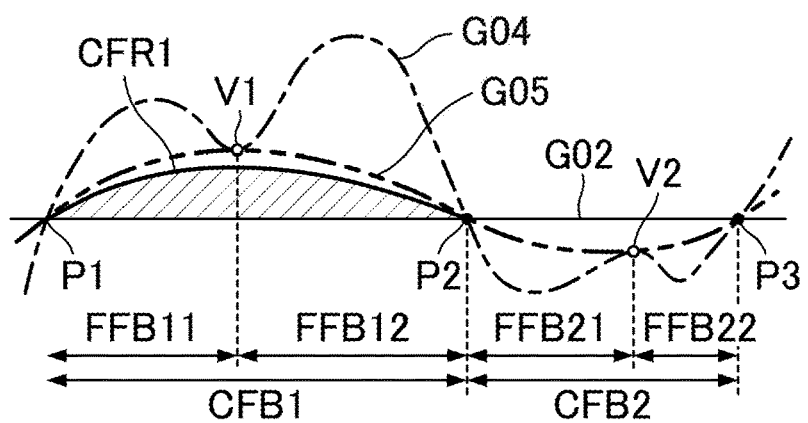
FIG. 15 shows an exemplary setting of an adjustment amount in the third operation mode.

FIG. 15 shows a display example of the area A01 in the coarse adjustment operation, and shows exemplary setting of an adjustment amount in the coarse partial band CFB1. In the coarse partial band CFB1, the initial adjustment amount (FIG. 14) is set to zero (percentage value); that is, the frequency responses of corresponding filters are flat (zero dB, without amplification or attenuation). Here, in a case where the user drags the line of the target characteristics in the band CFB1 (in this case, zero dB) toward (or away from) the graph G05 of the minimum smoothed characteristics, the adjustment amount in the band CFB1 is increased (or decreased) in the adjustment-amount update processing. In this way, an adjustment amount, which serves as a parameter for performing adjustment of differences between the target characteristics and the minimum smoothed characteristics in the band CFB1, is increased (or decreased) in a direction of gain. The line CFR1 (FIG. 15) displayed by the dragging operation represents the modified adjustment amount, that is, frequency responses of the corresponding filters.

In the coarse partial band CFB1, values of the minimum smoothed characteristics are higher than those of the target characteristics. Accordingly, the (coarse) frequency responses of the filters are set such that a gain in the band CFB1 is lowered in the correction where the minimum smoothed characteristics are moved close to the target characteristics, that is, in the correction where peaks in the minimum smoothed characteristics are lowered. In this exemplary operation, inverse characteristics (vertically inverted characteristics) of frequency responses of the filters are displayed. As the line CFR1 is set upward toward the target characteristics (corresponding to zero dB gain of the filters), sound signals in the band CFB1 become more attenuated.

In the fine adjustment operation, a fine partial band serves as a unit of operation for setting an adjustment amount. The user specifies a fine partial band for which an adjustment amount is to be set, and adjusts an adjustment amount indicative of a rate of adjustment applied to differences between the minimum smoothed characteristics (G05) and the smoothed characteristics (G04) within the specified fine partial band.

Figure 16:
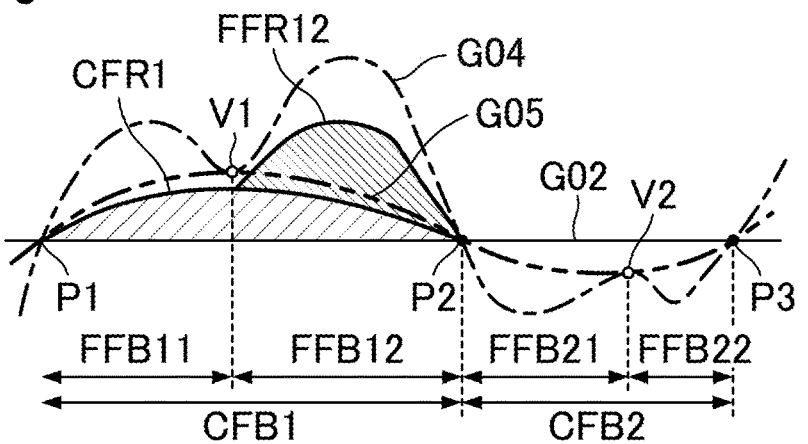
FIG. 16 shows an exemplary setting of the adjustment amount in the third operation mode.

FIG. 16 shows a display example of the area A01 in the fine adjustment operation in a case where the fine adjustment operation is performed subsequent to the coarse adjustment operation. FIG. 16 shows an exemplary setting of an adjustment amount in the fine partial band FFB12. In the fine partial band FFB12, an adjustment amount represented by the line CFR1 has already been set in the coarse adjustment operation. For example, in a case where the user drags the line CFR1 set in the band FFB12 toward (or away from) the graph G04 of the smoothed characteristics, an adjustment amount, which serves as a parameter for performing adjustment of differences between the minimum smoothed characteristics and the smoothed characteristics in the band FFB12, is increased (or decreased) in a direction of gain. The line FFR12 displayed after the dragging operation in the fine adjustment operation represents the modified adjustment amount, that is, frequency responses of the filters.

In the fine partial band FFB12, values of the smoothed characteristics are higher than those of the minimum smoothed characteristics. Accordingly, the (fine) frequency responses of the filters are set such that a gain in the band FFB12 is lowered in the correction where the smoothed characteristics are moved close to the minimum smoothed characteristics, that is, in the correction where peaks in the smoothed characteristics are lowered. In this exemplary operation, inverse characteristics of frequency responses of the filters are displayed. As the line FFR12 is set upward toward the line CFR1 (corresponding to zero dB gain of the filters), sound signals in the band FFB12 become more attenuated.

The overall frequency response of the filters is calculated by adding up, for all of the frequency bands, (coarse)

frequency responses based on adjustment amounts in coarse partial bands set in the coarse adjustment operation, and (fine) frequency responses based on adjustment amounts in fine partial bands set in the fine adjustment operation. In this exemplary operation, if the line CFR1 is set to a position matching the position of the graph G05 of the minimum smoothed characteristics in the coarse adjustment operation, the adjustment amount in the coarse partial band CFB1 will be set to 100%, resulting in the differences between the target characteristics and the minimum smoothed characteristics being corrected by 100% in the band CFB1. In this state, if the line FFR12 is set to a position matching the position of the graph G04 of the smoothed characteristics by the fine adjustment operation, the adjustment amount in the fine partial band FFB12 will be set to 100%, resulting in the differences between the minimum smoothed characteristics and the smoothed characteristics being corrected by 100% in the band FFB12.

As described above, in the third operation mode, coarse partial bands and fine partial bands, which serve as operation units, are extracted by appropriately combining the target characteristics, the smoothed characteristics, and/or the minimum smoothed characteristics. By adjusting adjustment amounts in coarse partial bands and adjustment amounts in fine partial bands, the user is able to correct frequency characteristics as desired. In the third operation mode, one of two procedures, the adjustment amount setting in the coarse adjustment operation and the adjustment amount setting in the fine adjustment operation, may be omitted. In a case where both of these procedures are executed, either one may be executed before the other, or the procedures may be executed alternately. For each dragging operation performed by the user on the same window, one of these procedures may be selected in accordance with a starting position of the dragging operation, and executed.

Ways of displaying or performing operations for setting adjustment amounts are not limited to the examples described above. For example, to make an operation easy for setting adjustment amounts, there may be displayed a graph representative of differences between the target characteristics and the minimum smoothed characteristics, a graph representative of differences between the minimum smoothed characteristics and the smoothed characteristics, and/or a graph representative of differences between the target characteristics and the smoothed characteristics. Additionally, instead of inverse characteristics, forward characteristics (upward change indicates an increase and downward change indicates a decrease) may be displayed as frequency responses of filters. In the example shown in FIG. 14, the target characteristics are flat frequency characteristics of zero dB. Accordingly, the graph G04 may be regarded as a graph representative of differences between the target characteristics and the smoothed characteristics, and the graph G05 may be regarded as a graph representative of differences between the target characteristics and the minimum smoothed characteristics.

The configuration of the frequency-characteristic adjuster 1 in the second embodiment is similar to that of the frequency-characteristic adjuster 1 in the first embodiment. With the controller 210 operating under execution of the adjustment support program, operations in the first operation mode, the second operation mode, and the third operation mode are executed as shown in the flowchart in FIG. 4. Operations performed in the first operation mode and in the second operation mode are similar to those described in the first embodiment. Operations in the third operation mode are performed in the following manner. By the acquisition processing, there are acquired target characteristic data indicative of the target characteristics, smoothed characteristic data indicative of the smoothed characteristics, and minimum smoothed characteristic data indicative of the minimum smoothed characteristics. In acquiring the minimum smoothed characteristics, differences between the target characteristic data and the smoothed characteristic data may be obtained, and minimum smoothed data may be calculated by smoothing minimum values of the obtained differences. Next, by the extraction processing, coarse partial bands and fine partial bands, which serve as operation units, are extracted. By the extraction processing, a frequency band is divided into multiple coarse partial bands, and the frequency band is divided into multiple fine partial bands. By the setting processing, coarse partial bands for the coarse adjustment operation and fine partial bands for the fine adjustment operation are set as operation units in the setting operation of adjustment amounts. By the display control processing, there are displayed, for example, the graph G02 of the target characteristics, the graph G04 of the smoothed characteristics, and the graph G05 of the minimum smoothed characteristics.

By the processing carried out in accordance with content of an operation (step SA180), in accordance with an operation performed by the user by which a single coarse partial band is selected and an adjustment amount of frequency characteristics is set, the value of the adjustment amount corresponding to the selected coarse partial band is changed. In accordance with the changed adjustment amount, there is set a (coarse) frequency response of a filter corresponding to the selected coarse partial band. Furthermore, by the processing carried out in accordance with content of an operation (step SA180), in accordance with an operation performed by the user by which a single fine partial band is selected and an adjustment amount of frequency characteristics is set, the value of the adjustment amount corresponding to the selected fine partial band is changed. In accordance with the changed adjustment amount, there is set a (fine) frequency response of a filter corresponding to the selected fine partial band.

From the embodiments described above as examples, the exemplary configurations described below will be understood.

A method for setting a filter frequency response in a first aspect includes: dividing a target frequency band into multiple first partial bands at a frequency corresponding to an intersection between a first line representative of a target spectrum envelope and a second line representative of a first spectrum envelope derived from smoothing a measured frequency spectrum (a dividing step); and setting a frequency response of a filter corresponding to a first partial band specified by an operator from among the multiple first partial bands, in accordance with a setting operation for setting an adjustment amount performed by the operator with respect to the specified first partial band (a setting step). In this aspect, frequencies corresponding to intersections between the first line and the second line define a first partial band that serves as a unit of a setting operation for setting an adjustment amount performed to set a frequency response of a filter. In this way, the user is able to easily recognize and carry out operations to make adjustments to the first partial band.

In a preferred aspect (second aspect) of the first aspect, the method further includes displaying the frequency response of the filter in a two-dimensional display area having an axis of frequency and an axis of gain. In this aspect, the user is able to perform operations while viewing the frequency response of the filter. Thus, the user is able to easily set adjustment amounts.

In a preferred aspect (third aspect) of the second aspect, in the displaying of the frequency response of the filter, the first line and the second line are displayed in the display area. In this aspect, the user is able to perform operations while viewing the first line and the second line. Thus, the user is able to easily set adjustment amounts.

In a preferred aspect (fourth aspect) of the second aspect, in the displaying of the frequency response of the filter, a difference between the first line and the second line is displayed in the display area. In this aspect, the user is able to perform operations while viewing the difference between the first line and the second line. Thus, the user is able to easily set adjustment amounts.

In a preferred aspect (fifth aspect) of the third aspect, the target frequency band is restricted to within a lower limit frequency and an upper limit frequency set by the operator. In this aspect, the user is able to perform adjustments on a desired frequency band.

In a preferred aspect (sixth aspect) of the fifth aspect, the second line is edited to smoothly join the first line in a first range equal to or lower than the lower limit frequency, in a second range equal to or higher than the upper limit frequency, or in the first and second ranges. In this aspect, at least one of the first range or the second range can be excluded from a range in which adjustment is performed by filters. Additionally, by viewing the second line, the user can readily see which range is excluded.

In a preferred aspect (seventh aspect) of the first aspect, in the setting of the frequency response of the filter, the frequency response of the filter corresponding to the specified first partial band is set in accordance with the setting operation by which the operator sets the adjustment amount based on a rate applied to a difference between the first line and the second line in the specified first partial band. In this aspect, the user is able to set adjustment amounts for making a correction in which the difference between the first line and the second line is reduced, without cumbersome operations such as setting center frequencies or Q values.

In a preferred aspect (eighth aspect) of the first aspect, the method further includes modifying the first line in accordance with a modifying operation performed by the operator for modifying the first line. In this aspect, the first line can be modified in accordance with a user's instruction.

In a preferred aspect (ninth aspect) of the first aspect, the first line represents a spectrum envelope specified from among multiple types of spectrum envelopes prepared in advance. In this aspect, the user is able to specify a desired target spectrum envelope.

In a preferred aspect (tenth aspect) of the first aspect, the method further includes: dividing the target frequency band into multiple second partial bands at a frequency corresponding to an intersection between the second line and a third line representative of a second spectrum envelope derived from smoothing the measured frequency spectrum at a degree lower than a degree at which the measured frequency spectrum is smoothed to derive the first spectrum envelope; setting a frequency response of a filter corresponding to a second partial band specified by the operator from among the multiple second partial bands, in accordance with a setting operation for setting an adjustment amount performed by the operator with respect to the specified second partial band. In this aspect, by the setting operation of an adjustment amount performed on the first partial band, it is possible to correct bumps present in the first spectrum envelope, where the bumps are coarse as compared to those present in the second spectrum envelope. Furthermore, by the setting operation of an adjustment amount performed on the second partial band, it is possible to correct bumps present in the second spectrum envelope, where the bumps are fine as compared to those present in the first spectrum envelope.

In a preferred aspect (eleventh aspect) of the first aspect, the first line represents a third spectrum envelope derived from smoothing the measured frequency spectrum at a degree higher than a degree at which the measured frequency spectrum is smoothed to derive the first spectrum envelope. In this aspect, by the setting operation of an adjustment amount performed on the first partial band, it is possible to correct bumps present in the first spectrum envelope, where the bumps are fine as compared to those present in the third spectrum envelope.

In a preferred aspect (twelfth aspect) of the first aspect, the method further includes: dividing each of the first partial bands into multiple second partial bands at a frequency corresponding to a turning point in a difference between the first line and the second line; and setting a frequency response of a filter corresponding to a second partial band specified from among the multiple second partial bands, in accordance with a setting operation for setting an adjustment amount performed by the operator with respect to the specified second partial band. In this aspect, it is possible to easily perform coarse adjustment on a first partial band, which is wider than a second partial band, and perform fine adjustment on a second partial band, which is narrower than a first partial band.

In a preferred aspect (thirteenth aspect) of the first aspect, the measured frequency spectrum is a frequency spectrum of a waveform of sound for measurement, the sound being output and received by a microphone. In this aspect, a frequency spectrum that has been actually measured for a sound reproduction system can be used as a target to be adjusted.

In a preferred aspect (fourteenth aspect) of the first aspect, the method further includes modifying the second line in accordance with a modifying operation performed by the operator for modifying the second line. In this aspect, the second line can be modified in accordance with a user's instruction.

In a preferred aspect (fifteenth aspect) of the first aspect, the method further includes modifying a width of a first partial band, from among the multiple first partial bands, in accordance with an intersection-moving operation by which the operator moves a position of at least one of two intersections sandwiching the first partial band in a frequency direction. In this aspect, since the width of a first partial band can be changed, the frequency response of the filter can be set flexibly.

An apparatus for setting a filter frequency response according to a preferred aspect (sixteenth aspect) includes: a divider that divides a target frequency band into multiple first partial bands at a frequency corresponding to an intersection between a first line representative of a target spectrum envelope and a second line representative of a first spectrum envelope derived from smoothing a measured frequency spectrum; and a setter that sets a frequency response of a filter corresponding to a first partial band specified by an operator from among the multiple first partial bands, in accordance with a setting operation for setting an adjustment amount performed by the operator with respect to the specified first partial band.

In another aspect of the present disclosure, there may be provided a program that causes a computer, such as a CPU, to serve as the divider and the setter (or, a program that causes a computer to execute a method including the dividing step and the setting step). For example, in a case where a terminal device, such as a personal computer or a tablet terminal, is used as the user interface of the frequency-characteristic adjuster, a controller (CPU) of the terminal device may operate under execution of the program. In this way, the user is enabled to perform adjustment by which frequency characteristics for adjustment are brought close to the target characteristics in the specified partial band alone, and such adjustment can be performed by way of an operation that is both easy and intuitive. Exemplary ways for providing the program include: distribution of a computer-readable storage medium, such as a CD-ROM (compact disk-read only memory) or a flash ROM (read only memory), on which the program has been written; and distribution by making the program downloadable via telecommunication, such as the Internet.

A method for setting a filter frequency response according to a preferred aspect (seventeenth aspect) includes: dividing a target frequency band into multiple first partial bands at a frequency corresponding to an intersection between a first line representative of a target spectrum envelope and a second line representative of a first spectrum envelope derived from smoothing a measured frequency spectrum; dividing each first partial band into multiple second partial bands at a frequency corresponding to a turning point in a difference between the first line and the second line; setting a frequency response of a filter corresponding to a first partial band specified by an operator from among the multiple first partial bands, in accordance with a setting operation for setting an adjustment amount performed by the operator on the specified first partial band; and setting a frequency response of a filter corresponding to a second partial band specified by the operator from among the multiple second partial bands, in accordance with a setting operation for setting an adjustment amount performed by the operator on the specified second partial band. In this aspect, the user is able to easily perform coarse adjustment on a first partial band, which is wider than a second partial band, and perform fine adjustment on a second partial band, which is narrower than a first partial band.

In a preferred aspect (eighteenth aspect) of the seventeenth aspect, the method further includes displaying the frequency response of the filter corresponding to the first partial band and the frequency response of the filter corresponding to the second partial band in a two-dimensional display area having an axis of frequency and an axis of gain. In this aspect, the user is able to perform operations while viewing the frequency response of the filter corresponding to the first partial band and the frequency response of the filter corresponding to the second partial band. Thus, the user can easily set adjustment amounts.

In a preferred aspect (nineteenth aspect) of the seventeenth aspect, in the displaying of the frequency responses of the filters, the first line and the second line are displayed in the display area. In this aspect, the user is able to perform operations while viewing the first line and the second line. Thus, the user can easily set adjustment amounts.

In a preferred aspect (twentieth aspect) of the seventeenth aspect, in the setting of the frequency response of the filter corresponding to the specified first partial band, the frequency response of the filter corresponding to the specified first partial band is set in accordance with the setting operation by which the operator sets the adjustment amount based on a rate applied to a difference between the first line and a fourth line formed by connecting the intersection and the turning point at the specified first partial band. In this aspect, the user is able to set adjustment amounts for making a correction in which the difference between the first line and the fourth line is reduced, without need for cumbersome operations such as setting center frequencies or Q values.

In a preferred aspect (twenty-first aspect) of the seventeenth aspect, in the setting of the frequency response of the filter corresponding to the specified second partial band, the frequency response of the filter corresponding to the specified second partial band is set in accordance with the setting operation by which the operator sets the adjustment amount based on a rate applied to a difference between the second line and a fourth line formed by connecting the intersection and the turning point at the specified second partial band. In this aspect, the user is able to set adjustment amounts for making a correction in which the difference between the second line and the fourth line is reduced, without need for cumbersome operations such as setting center frequencies or Q values.

In a preferred aspect (twenty-second aspect) of the seventeenth aspect, the method further includes modifying the first line in accordance with a modifying operation performed by the operator for modifying the first line. In this aspect, the first line can be modified in accordance with a user's instruction.

In a preferred aspect (twenty-third aspect) of the seventeenth aspect, the method further includes modifying the second line in accordance with a modifying operation performed by the operator for modifying the second line. In this aspect, the second line can be modified in accordance with a user's instruction.

A method for setting a filter frequency response according to a preferred aspect (twenty-fourth aspect) includes: dividing a target frequency band into multiple partial bands at a frequency corresponding to an intersection between a first line representative of a target spectrum envelope and a second line representative of a first spectrum envelope derived from smoothing a measured frequency spectrum and at a frequency corresponding to a turning point in a difference between the first line and the second line; setting a frequency response of a filter corresponding to a partial band specified by an operator from among the multiple partial bands, in accordance with a setting operation for setting an adjustment amount performed by the operator on the specified partial band. In this aspect, frequencies corresponding to intersections between the first line and the second line and frequencies corresponding to turning points in the difference between the first line and the second line define partial bands that each serve as a unit of operation for setting an adjustment amount performed for setting a frequency response of a filter. In this way, the user is able to easily recognize and carry out operations to make adjustments to the partial bands.

In a preferred aspect (twenty-fifth aspect) of the twenty-fourth aspect, the method further includes displaying the frequency response of the filter in a two-dimensional display area having an axis of frequency and an axis of gain. In this aspect, the user is able to perform operations while viewing the frequency response of the filter. Thus, the user is able to easily set adjustment amounts.

In a preferred aspect (twenty-sixth aspect) of the twenty-fourth aspect, in the displaying of the frequency response of the filter, the first line and the second line are displayed in the display area. In this aspect, the user is able to perform operations while viewing the first line and the second line. Thus, the user is able to easily set adjustment amounts.

DESCRIPTION OF REFERENCE SIGNS

1 . . . frequency-characteristic adjuster; 2 . . . sound space; 3 . . . loudspeaker; 10 . . . main body; 110 . . . microphone input terminal; 120 . . . source input terminal; 130 . . . speaker output terminal; 20 . . . remote controller; 210 . . . controller; 220 . . . external device interface; 230 . . . user interface; 232 . . . operation input means; 234 . . . display means; 240 . . . memory storage; 242 . . . volatile storage; 244 . . . non-volatile storage; 250 . . . bus.

What is claimed is:

1. A method for setting a filter frequency response, the method comprising:
    dividing a target frequency band into multiple first partial bands at a frequency corresponding to an intersection between a first line representative of a target spectrum envelope and a second line representative of a first spectrum envelope derived from smoothing a measured frequency spectrum; and
    setting a frequency response of a filter corresponding to a first partial band specified by an operator from among the multiple first partial bands, in accordance with a setting operation for setting an adjustment amount performed by the operator with respect to the specified first partial band.

2. The method for setting a filter frequency response according to claim 1, the method further comprising displaying the frequency response of the filter in a two-dimensional display area having an axis of frequency and an axis of gain.

3. The method for setting a filter frequency response according to claim 2,
    wherein in the displaying of the frequency response of the filter, the first line and the second line are displayed in the display area.

4. The method for setting a filter frequency response according to claim 3,
    wherein the target frequency band is restricted to within a lower limit frequency and an upper limit frequency set by the operator.

5. The method for setting a filter frequency response according to claim 4,
    wherein the second line is edited so as to smoothly join the first line in a first range equal to or lower than the lower limit frequency, in a second range equal to or higher than the upper limit frequency, or in the first and second ranges.

6. The method for setting a filter frequency response according to claim 2,
    wherein in the displaying of the frequency response of the filter, a difference between the first line and the second line is displayed in the display area.

7. The method for setting a filter frequency response according to claim 1,
    wherein in the setting of the frequency response of the filter, the frequency response of the filter corresponding to the specified first partial band is set in accordance with the setting operation by which the operator sets the adjustment amount based on a rate applied to a difference between the first line and the second line in the specified first partial band.

8. The method for setting a filter frequency response according to claim 1, the method further comprising modifying the first line in accordance with a modifying operation performed by the operator for modifying the first line.

9. The method for setting a filter frequency response according to claim 1,
    wherein the first line represents a spectrum envelope specified from among multiple types of spectrum envelopes prepared in advance.

10. The method for setting a filter frequency response according to claim 1, the method further comprising:
    dividing the target frequency band into multiple second partial bands at a frequency corresponding to an intersection between the second line and a third line representative of a second spectrum envelope derived from smoothing the measured frequency spectrum at a degree lower than a degree at which the measured frequency spectrum is smoothed to derive the first spectrum envelope;
    setting a frequency response of a filter corresponding to a second partial band specified by the operator from among the multiple second partial bands, in accordance with a setting operation for setting an adjustment amount performed by the operator with respect to the specified second partial band.

11. The method for setting a filter frequency response according to claim 1,
    wherein the first line represents a third spectrum envelope derived from smoothing the measured frequency spectrum at a degree higher than a degree at which the measured frequency spectrum is smoothed to derive the first spectrum envelope.

12. The method for setting a filter frequency response according to claim 1, the method further comprising:
    dividing each of the first partial bands into multiple second partial bands at a frequency corresponding to a turning point in a difference between the first line and the second line; and
    setting a frequency response of a filter corresponding to a second partial band specified by the operator from among the multiple second partial bands, in accordance with a setting operation for setting an adjustment amount performed by the operator with respect to the specified second partial band.

13. The method for setting a filter frequency response according to claim 1,
    wherein the measured frequency spectrum is a frequency spectrum of a waveform of sound for measurement, the sound being output and received by a microphone.

14. The method for setting a filter frequency response according to claim 1, the method further comprising modifying the second line in accordance with a modifying operation performed by the operator for modifying the second line.

15. The method for setting a filter frequency response according to claim 1, the method further comprising modifying a width of a first partial band, from among the multiple first partial bands, in accordance with an intersection-moving operation by which the operator moves a position of at least one of two intersections sandwiching the first partial band in a frequency direction.

16. An apparatus for setting a filter frequency response, the apparatus comprising a processor configured to execute stored instructions to:
    divide a target frequency band into multiple first partial bands at a frequency corresponding to an intersection between a first line representative of a target spectrum envelope and a second line representative of a first spectrum envelope derived from smoothing a measured frequency spectrum; and set a frequency response of a filter corresponding to a first partial band specified by an operator from among the multiple first partial bands, in accordance with a setting operation for setting an adjustment amount performed by the operator with respect to the specified first partial band.

* * * * *